United States Patent
Baarman et al.

(10) Patent No.: US 7,973,635 B2
(45) Date of Patent: Jul. 5, 2011

(54) PRINTED CIRCUIT BOARD COIL

(75) Inventors: David W. Baarman, Fennville, MI (US); Joshua K. Schwannecke, Grand Rapids, MI (US); Warren E. Guthrie, West Olive, MI (US); Richard A. Wahl, Holland, MI (US); Paul Duckworth, Holland, MI (US)

(73) Assignee: Access Business Group International LLC, Ada, MI (US)

( * ) Notice: Subject to any disclaimer, the term of this patent is extended or adjusted under 35 U.S.C. 154(b) by 9 days.

(21) Appl. No.: 12/236,832

(22) Filed: Sep. 24, 2008

(65) Prior Publication Data

US 2009/0085706 A1 Apr. 2, 2009

Related U.S. Application Data

(60) Provisional application No. 61/044,298, filed on Apr. 11, 2008, provisional application No. 60/975,953, filed on Sep. 28, 2007.

(51) Int. Cl.
- *H01F 27/28* (2006.01)
- *H01F 21/02* (2006.01)
- *H01F 27/29* (2006.01)
- *H01F 5/00* (2006.01)

(52) U.S. Cl. ........ 336/222; 336/147; 336/192; 336/200; 336/223; 336/232

(58) Field of Classification Search ................ None
See application file for complete search history.

(56) References Cited

U.S. PATENT DOCUMENTS

| | | | |
|---|---|---|---|
| 5,036,160 A * | 7/1991 | Jackson | 174/33 |
| 5,039,824 A | 8/1991 | Takashimi et al. | |
| 5,357,050 A * | 10/1994 | Baran et al. | 174/33 |
| 5,430,247 A | 7/1995 | Bockelman | |
| 5,646,368 A * | 7/1997 | Muyshondt et al. | 174/33 |
| 6,380,835 B1 * | 4/2002 | Lee | 336/200 |

(Continued)

FOREIGN PATENT DOCUMENTS

KR  1020070097580  * 10/2007

(Continued)

OTHER PUBLICATIONS

Written Opinion and International Search Report, International Filing date Sep. 26, 2008.

*Primary Examiner* — Anh T Mai
*Assistant Examiner* — Mangtin Lian
(74) *Attorney, Agent, or Firm* — Warner Norcross & Judd LLP

(57) ABSTRACT

A multilayer printed circuit board ("PCB") coil that simulates a coil formed from litz wire. The PCB includes a plurality of alternating conductor and insulating layers interconnected to cooperatively form the coil. Each conductor layer includes a trace that follows the desired coil shape and is divided into a plurality of discrete conductor segments. The segments are electrically connected across layers to provide a plurality of current flow paths (or filaments) that undulate between the layers in a regular, repeating pattern. The coil may be configured so that each filament spends a substantially equal amount of time in proximity to the paired coil and therefore contributes substantially equally to the self or mutual inductance of the coil. Each conductor layer may include a plurality of associated traces and intralayer connector that interconnected so that each filament undulates not only upwardly/downwardly, but also inwardly/outwardly in a regular, repeating pattern.

26 Claims, 16 Drawing Sheets

U.S. PATENT DOCUMENTS

| | | |
|---|---|---|
| 6,914,508 B2 | 7/2005 | Ferencz et al. |
| 6,967,555 B2 * | 11/2005 | Yu et al. .................. 336/200 |
| 6,996,892 B1 * | 2/2006 | Dening et al. ............ 29/602.1 |
| 2004/0263308 A1 | 12/2004 | Yu et al. |
| 2006/0209487 A1 | 9/2006 | Schmidt et al. |
| 2008/0030292 A1 * | 2/2008 | Kubono et al. ............ 336/84 C |
| 2008/0122568 A1 * | 5/2008 | Yan et al. .................. 336/200 |

FOREIGN PATENT DOCUMENTS

WO 2008093334 8/2008

* cited by examiner

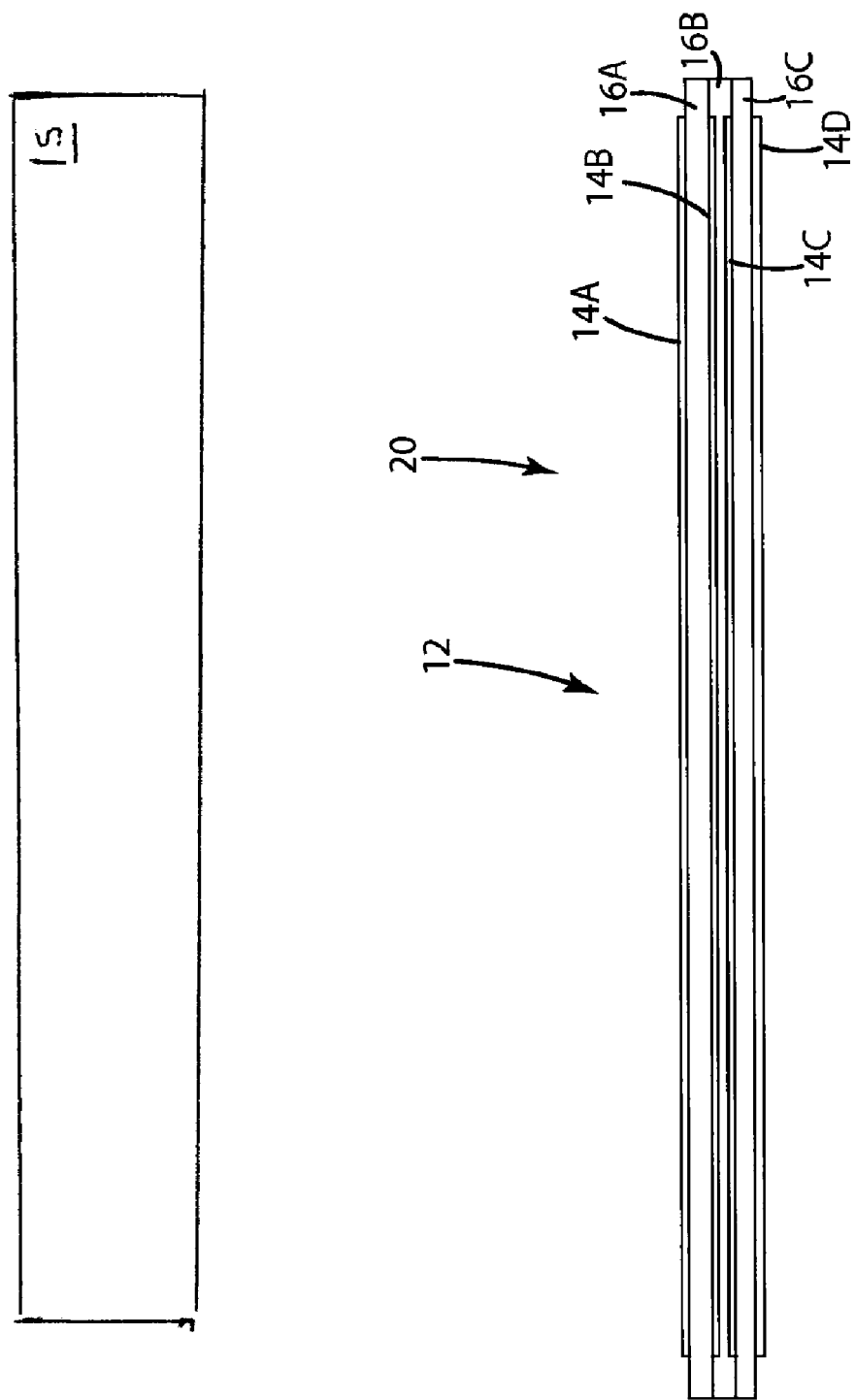

PRINTED CIRCUIT BOARD COIL

BACKGROUND OF THE INVENTION

The present invention relates to electromagnetic coils, and more particularly to multilayer printed circuit board electromagnetic coils.

Electromagnetic coils are used in a wide variety of electrical applications in connection with the inductive transfer of power. For example, different forms of electrical coils are used in transformers, inductive power couplings and motors. Historically, electrical coils have been formed by wrapping a strand of wire into one or more loops. Typically, the diameter of the coil, the type and diameter of the wire, the number of loops (or turns) and other characteristics of the wire and the coil are selected to provide the desired electromagnetic power transfer characteristics.

It is well known that alternating electrical current (AC) has a tendency to distribute itself within a conductor so that the current density near the surface of the conductor is greater than at its core. This phenomenon is commonly referred to as the "skin effect." The skin effect causes the effective resistance of a conductor to increase with the frequency of the AC current. In an effort to overcome the skin effect, electromagnetic coils used in high frequency applications are often wound from litz wire. Litz wire can be generally characterized as a special type of wire that includes many thin wires, individually coated with an insulating film and twisted together. The individual wires are combined and twisted following a carefully prescribed pattern often involving several levels of twisting (groups of twisted wires are twisted together, etc.). Typically, the wire will be twisted so that each individual strand spends a substantially equal amount of time in proximity to the paired coil. Accordingly, each strand intercepts a substantially equal amount of magnetic flux lines from the paired coil and contributes substantially equally to the self or mutual inductance characteristics of the coil. Because of the combination of separate smaller wires, the combined conductor has greater surface area than a solid conductor using the total cross sectional area and thereby has reduced skin effect. As a result of this and the unique twisting configuration, the power losses associated with litz wire coils can be substantially lower than conventional solid wire coils when used in high-frequency applications. Even with its advantages, litz wire suffers from a number of disadvantages. First, the resistance of a litz wire coil is higher then theoretically achievable because individual strands are round and coated with insulator so that the overall cross-section includes a substantial amount of non-conducting elements, such as air and insulator. Second, the resulting structure is relatively delicate and each strand is subject to breakage. An outer sheath is often incorporated in an attempt to protect the strands. This sheath adds to the overall cost and provides even more resistance over that theoretically achievable. Third, the conductors are thermally insulated and have no heat-carrying path aside from the conductors themselves. So, power handling can be reduced because of thermal considerations. Fourth, the manufacturing process for litz wire and litz wire coils is relatively expensive and requires special, costly equipment. Fifth, the litz wire may be bulkier than desired for some applications because of packing density from wire to wire and the space occupied by the insulation between strands.

Wire coils are relatively expensive to manufacture (particularly litz wire coils), occupy a relatively large amount of space and often require mechanical mounting of the coil to a printed circuit board. To address these issues, it is known to integrate a coil directly into a printed circuit board, for example, by forming the coil on the circuit board using a spiral-shaped trace. In some applications the printed circuit board includes multiple layers of spiral traces that are joined together by vias to form a coil of the desired number of turns (e.g. U.S. Pat. No. 6,914,508 to Ferencz et al, which issued on Jul. 5, 2005). Although printed circuit board coils can present some advantages over wire coils, conventional printed circuit board coils suffer from certain problems faced by conventional solid wires, such as those associated with uneven distribution of induced current and uneven distribution of inductance within the PCB coil. Further, stacked PCB coils can introduce unwanted parasitic capacitance due to some of the coils receiving more of the magnetic field than others. Ultimately, this can result in higher resistance and losses.

SUMMARY OF THE INVENTION

The present invention provides a multilayer printed circuit board ("PCB") coil that simulates a coil formed from litz wire. The PCB includes a plurality of alternating conductor and insulating layers. The conductor layers are interconnected such that they cooperatively form the coil. Each conductor layer includes a trace that follows the desired coil shape and is divided to provide a plurality of discrete conductor segments. In one embodiment, each conductive layer of the PCB includes a generally spiral-shaped trace having a plurality of electrically discrete segments. The segments are electrically connected across layers to provide a plurality of current flow paths (or filaments) that undulate between the layers. In one embodiment, the coil is configured such that each filament spends a substantially equal amount of time in proximity to the paired coil. Accordingly, each filament contributes substantially equally to the self or mutual inductance of the coil.

In one embodiment, the layers of the PCB include substantially coextensive spiral traces that overlie one another in a stacked relationship. In this embodiment, the traces may include substantially identical segmentation, thereby providing aligned interchanges to facilitate electrical coupling of segments on different layers.

In one embodiment, the segments of different layers are electrically coupled at interchanges by vias extending between the layers. Each interchange may be specially shaped to minimize obstructions at and near the vias. In one embodiment, each interchange includes a separate via for each conductive layer. For example, a PCB coil with four layers may include four vias. In other embodiments, some or all of the conductive layer may include multiple vias.

As noted above, the filaments undulate upwardly and downwardly through the plurality of conductors. Additionally, in one embodiment, the filaments may undulate inwardly and outwardly to provide an additional degree of motion. In one embodiment, each layer of the coil may include two adjacent, segmented traces in the form of substantially parallel spirals that extend in a paired relationship. In this embodiment, the coil may include interlayer and/or intralayer connectors that connect the segments of different layers and of paired traces in a pattern that define a plurality of filaments that undulate upwardly/downwardly and inwardly/outwardly such that each strand spends substantially the same amount of time in proximity to a paired coil. The upwardly/downwardly and inwardly/outwardly undulation of each filament simulates the twisting nature of the strands of a litz wire coil.

The present invention provides a simple and effective PCB coil that overcomes important disadvantages of prior PCB coils, while maintaining many of the advantages of PCB coils. The presence of multiple, undulating current flow paths reduces skin effect and lower losses compared to conventional PCB coils. The use of segmentation and interlayer connectors provides a reliable and easily implemented structure for electrically coupling the coil in the desired undulating pattern. Additionally, the undulation pattern of the filaments provides a coil in which each filament spends a substantially equal amount of time in proximity to the paired coil, which further improves efficiency of the coil because each filament contributes substantially equally to the self or mutual inductance of the coil. The present invention can also be implemented with inward/outward undulations to further simulate the current flow path of the strands of litz wire coils. The use of segmentation and interlayer connectors can lower parasitic capacitance by 1) decreasing the coil surface area to the segment surface area; and 2) introducing fringe effects that cancel each other out. Less capacitance allows inductance in the coil to be maximized which can result in lower resistance and less losses. These benefits are all provided while in a PCB coil that has thinner coils and allows for tighter coupling than a bulkier litz wire coil.

These and other objects, advantages, and features of the invention will be readily understood and appreciated by reference to the detailed description of the current embodiment and the drawings.

BRIEF DESCRIPTION OF THE DRAWINGS

FIG. 1A is side elevational view of a printed circuit board ("PCB") coil in accordance with an embodiment of the present invention.

DESCRIPTION OF THE CURRENT EMBODIMENT

Figure 1B:
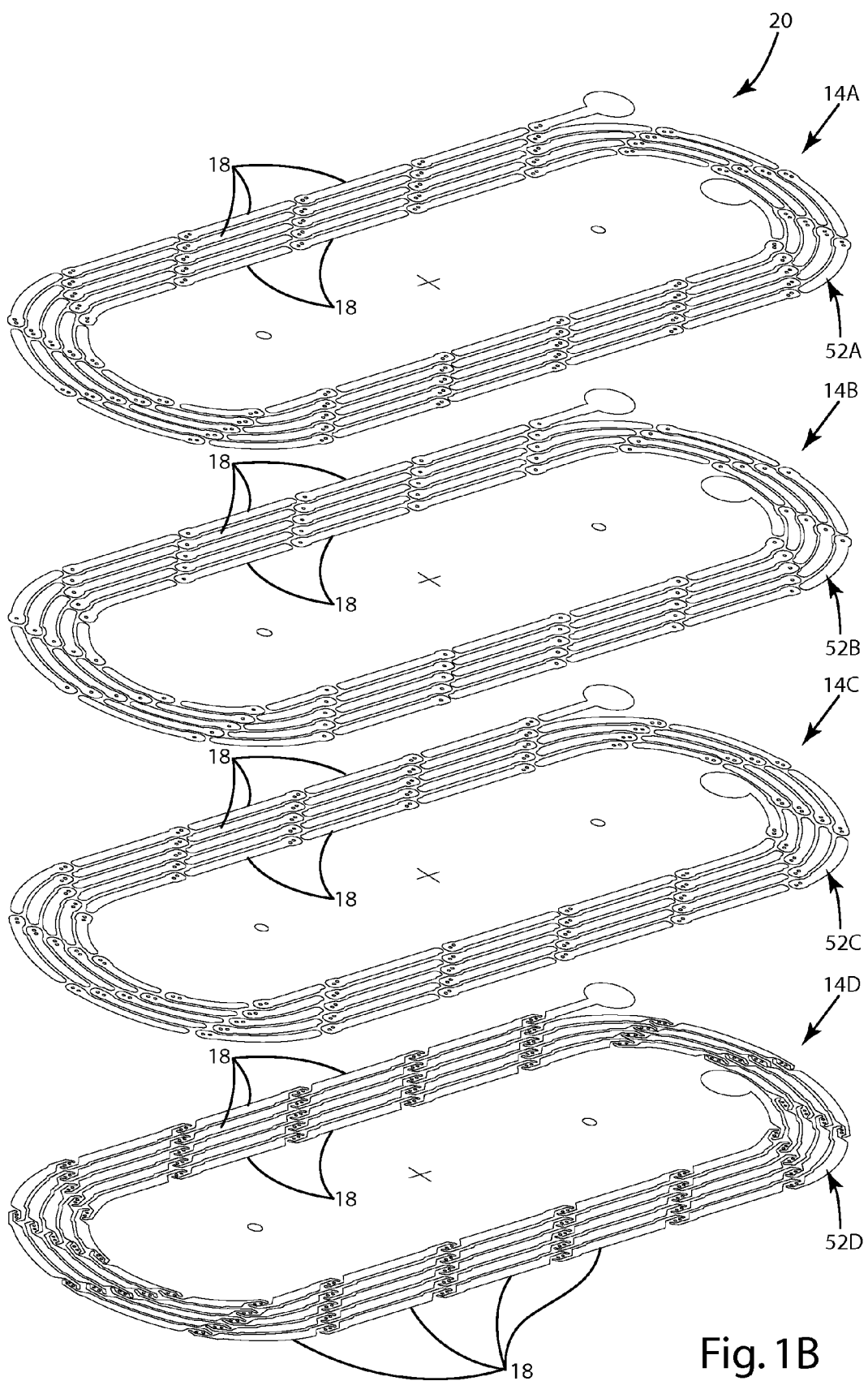
FIG. 1B is an exploded representational perspective view of the traces of the PCB coil.
Figure 1C:
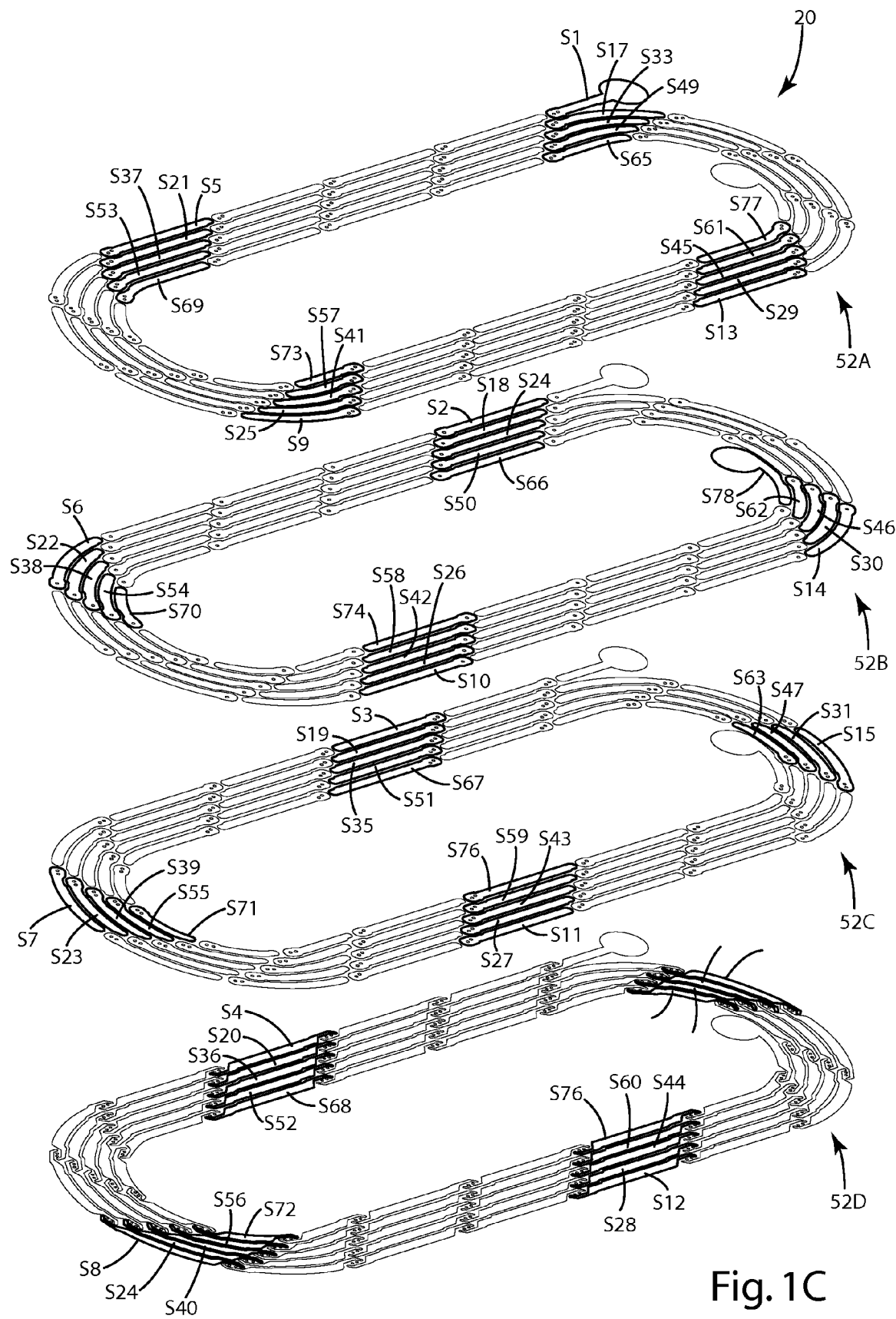
FIG. 1C is an exploded representational perspective view similar to FIG. 1B with select segments shaded to show the path of a single filament.

A printed circuit board ("PCB") coil 20 in accordance with an embodiment of the present invention is shown in FIGS. 1A, 1B and 1C. The PCB coil 20 generally includes a plurality of alternating conductor layers 14*a-d* and insulator layers 16*a-c* that cooperatively form a multilayer coil (See FIG. 1A). Each conductor layer 14*a-d* includes a trace 52*a-d* defined by a plurality of discrete segments 18 (See FIG. 1B). The segments 18 of different traces 52*a-d* in different conductor layers 14*a-d* are interconnected by connectors 40 to define "filaments" 54*a-d* (discrete current flow paths) that undulate through the layers in a predetermined pattern (See FIGS. 1C, 6 and 7). The predetermined pattern is designed so that there will be a substantially even distribution of power induced among the filaments 54*a-d* when the PCB coil is paired with a second inductive coil 15. In the illustrated embodiment, the PCB coil 20 simulates a litz wire coil in that the filaments 54*a-d*, though offset, follow substantially parallel undulations through the conductor layers 14*a-d*. In the illustrated embodiment, the filaments 54*a-d* follow substantially regular, repeating undulations with each filament 54*a-d* spending substantially the same amount of total time on each layer 14*a-d* of the PCB coil 20. The undulations occur frequently enough that all of the filaments 54*a-d* intercept a substantially equal amount of magnetic flux lines from the paired coil 15, and therefore inductively generate substantially equal amounts of power and represent substantially equal amounts of inductance. In the illustrated embodiment, each filament 54*a-d* passes through each layer approximately 4 times, but the number of undulations may vary from application to application.

Although shown in connection with a four-layer PCB coil, the present invention is well-suited and readily adapted for use with PCB coils with different numbers of layers. For example, a greater or smaller number of layers may be used to provide a coil with the desired characteristics. In applications with a greater number of layers, the segment connection patterns disclosed herein can be carried forward into additional layers or alternative connection schemes can be developed. The size, shape and configuration of the traces and segments in each layer may be varied to provide a PCB coil of the desired characteristics. For example, the present invention is illustrated in connection with a generally oval coil. The shape of the coil may vary from application to application as desired. For example, the present invention can be implemented in circular, rectangular, square and irregular shaped coils.

The present invention is shown in connection with a coreless PCB coil. The present invention can be incorporated into a paired set of coils that include a core, such as a magnetic core. For example, the PCB coil may define an aperture within the center of the coil of sufficient size to receive a core (not shown). The core may be separately manufactured and mounted within the aperture during assembly. If desired, a layer of magnetic material, such as, for example, ferromagnetic or ferrimagnetic material, may be incorporated into the PCB substrate so that the PCB substrate effectively functions as a barrier to stray electromagnetic field. If desired, the present invention may be incorporated into flexible circuit board design. In a flexible circuit design, flexible conductor layers and insulator layers may be disposed on a flexible substrate. The flexible circuit design may also include a flexible amorphous magnetic core material.

Although not shown, the electrical/electronic components to be used in association with the PCB coil may be populated on the same PCB assembly that carries the PCB coil. The present invention may be used in place of a wire coil or a conventional PCB coil in essentially any application. In some applications, the PCB coil may replace both coils in a coupled pair of coils. In other applications, the PCB coil may be used in conjunction with conventional coils, such as conventional wire coils or conventional PCB coils.

For purposes of this disclosure, directional terms such as "top," "bottom," "upper" and "lower" are used to denote directions relative to the orientation of the PCB coil shown in the figures. Similarly, terms such as "inward" and "outward" are used to denote directions toward and away from the center of the coil. These terms are used as expedients to describe the illustrated embodiments and are not intended to limit the present invention to implementation in any specific orientation.

As perhaps best shown in FIG. 1B, the PCB coil 20 is incorporated into a multilayer circuit board 12. The multilayer circuit board 12 may be manufactured in accordance with any suitable techniques and apparatus for manufacturing multilayer circuit boards, including both rigid and flexible circuit board constructions. The PCB coil 20 of FIG. 1B is defined by a plurality of conductor layers 14a-d that are spaced apart from one another by insulator layers 16a-c. The conductor layers 14a-d and insulator layers 16a-c may be essentially any materials suitable for use in the manufacture of multilayer circuit boards. In the illustrated embodiment, each conductor layer 14a-d is formed by a thin copper layer deposited on one major surface of a layer of circuit board substrate material, such as fiberglass. Conductor layers can be deposited on both major surfaces of a layer of circuit board substrate material so that two traces can be applied to a single layer of circuit board substrate material. In applications where more than two conductor layers are desired, additional traces can be disposed on additional layers of circuit board substrate material. The layers of circuit board substrate material can be stacked together to form the multilayer PCB. When a plurality of circuit board substrate material layers are included, adjacent layers may be separated by an additional insulative layer, such as a thin layer of fiberglass. The various conductive and insulative layers of the PCB coil can be heated and pressed together to form a single multilayer PCB, if desired. For example, the multilayer PCB may be manufactured using conventional lamination techniques and apparatus. Alternatively, the PCB coil may be manufactured using a stack of separate printed circuit board substrates that are spaced apart by insulative layers and are mechanically interconnected, for example, by screws (not shown).

Figure 2A:
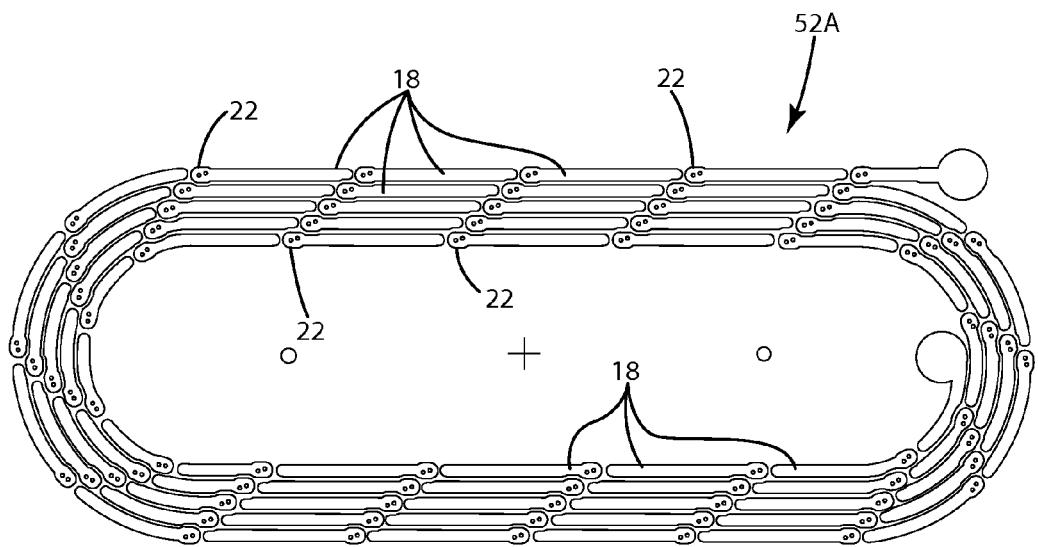
FIG. 2A is a top plan view of the trace of the first layer (or top) of the PCB coil.
Figure 2B:
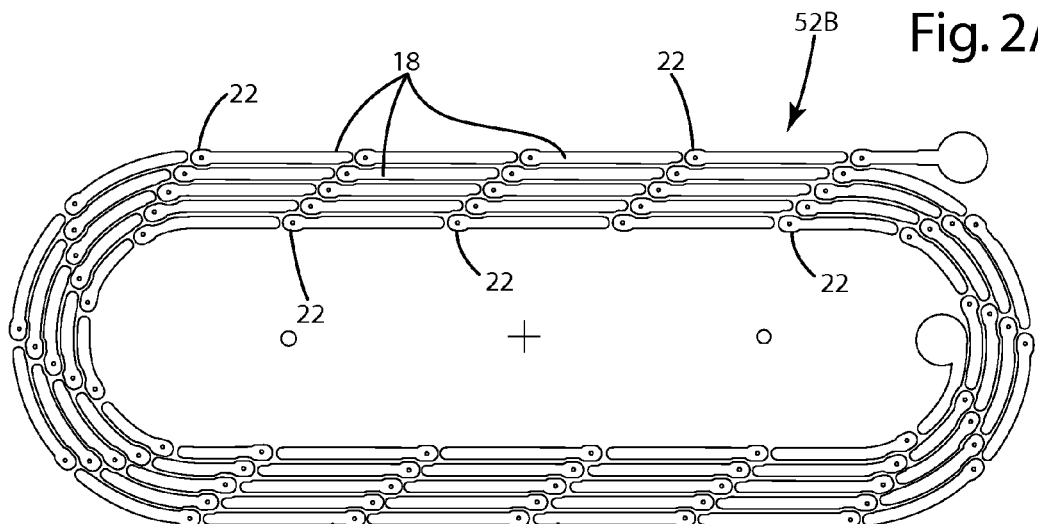
FIG. 2B is a top plan view of the trace of the second layer of the PCB coil.
Figure 2C:
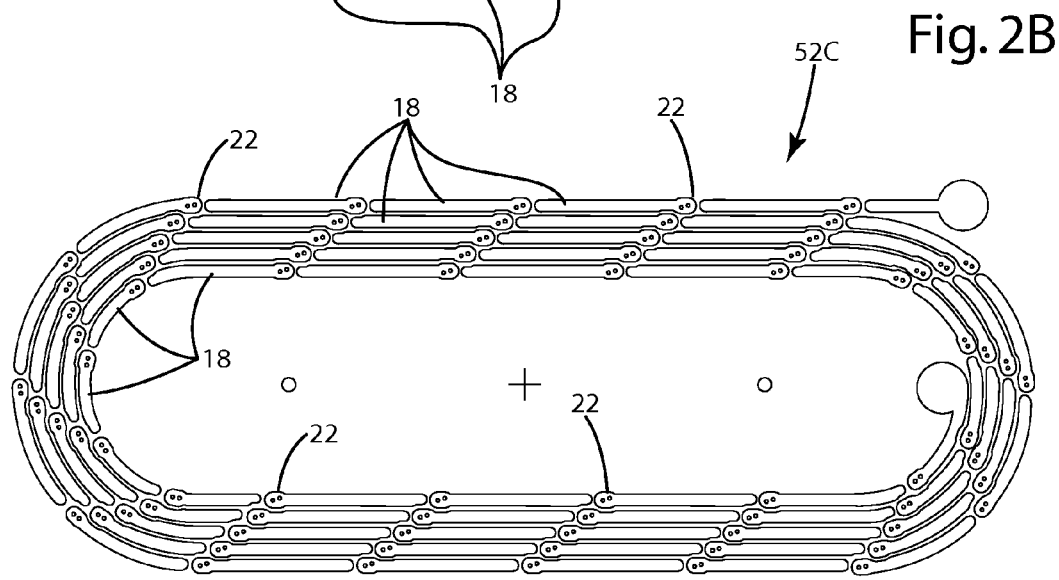
FIG. 2C is a top plan view of the trace of the third layer of the PCB coil.
Figure 2D:
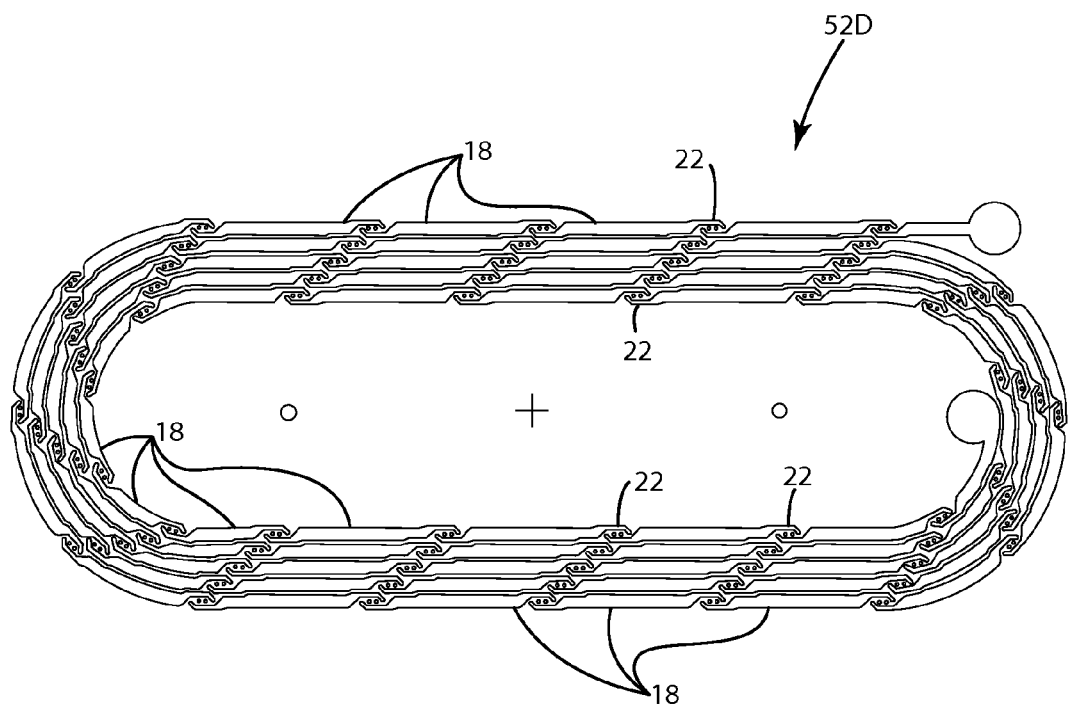
FIG. 2D is a top plan view of the trace of the fourth (or bottom) layer of the PCB coil.

In the illustrated embodiment, the conductor layers 14a-d include generally identical traces 52a-d. FIGS. 2A-2D show the traces 52a-d for a four-layer PCB coil 20 manufactured in accordance with an embodiment of the present invention. FIG. 2A shows a spiral trace 52a of the first, and uppermost, layer of the PCB coil 20. FIG. 2B shows the spiral trace 52b for the second layer. FIG. 2C shows the spiral trace for the third layer. Finally, FIG. 2D shows the spiral trace 52d for the fourth, and lowermost, layer. Although generally identical, there are some differences between the traces 52a-d. For example, the segments 18 may be offset from layer to layer to facilitate interconnection between the segments 18 of different layers. Given that the spiral traces 52a-d are generally identical only the uppermost spiral trace 52a will described in detail. The remaining traces 52b-d will be separately addressed to the extent necessary to address deviations from the uppermost trace 52a that merit specific discussion. As shown, the uppermost spiral trace 52a includes a plurality of conductor segments 18 arranged in a generally oval, spiraling pattern. The segments 18 in this trace 52a are elongated sections of electrically conductive material that are spaced apart from one another so that they are all electrically isolated (See, for example, FIGS. 2A-2D). Each of the remaining traces 52b-d includes a substantially identical arrangement of segments 18. When the conductor layers 14a-d and insulator layers 16a-c are combined, the traces 52a-d are substantially coextensive.

Figure 7:
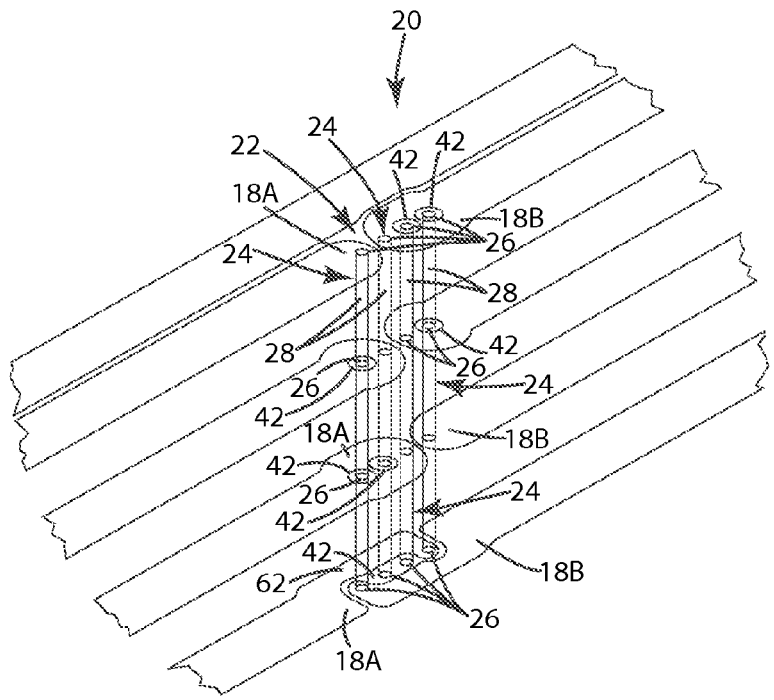
FIG. 7 is a perspective view of an interchange showing the overlapping arrangement of the segments.

As noted above, the segments 18 of different conductor layers 14a-d are electrically interconnected by a plurality of connectors 40 that chain the segments 18 together to define filaments 54a-d (described in more detail below). In the illustrated embodiment, interlayer connectors 40 are disposed at interchanges 22 located at opposite ends of each segment 18. As perhaps best shown in FIG. 7, the traces 52a-d are configured at the interchanges 22 so that the segments 18 overlap to permit the use of essentially conventional vias 24 for interconnecting segments 18 in different layers. The lowermost layer of the illustrated embodiment includes an interchange with a more complex shape. The lowermost interchange includes bypass portions 60 and 62 that facilitate connection of the outer end of the lowermost layer segment 18 with the inner end of the uppermost segment. The vias 24 are arranged to extend vertically between layers 14a-d from segment to segment in an arranged pattern as described in more detail below. Each via 24 generally includes an aperture 26 defined through the insulating materials and a conductor 28 extending through the aperture 26 to provide a current flow path through the insulating materials. The vias 24 may be formed by drilling through the circuit board stack to form the apertures 26 and then plating the apertures 26 with copper to form the conductors 28. For example, electroplating, electrolessplating or other plating techniques may be used. Although each via 24 may extend vertically through all of the layers 14a-d, the vias 24 are connected only to those segments 18 where an electrical connection is required to create the desired current flow pattern. With segments 18 where an electrical connection is desired, the via aperture drilling process will expose a portion of the segment 18 within the via aperture 26. Accordingly, when the conductor 28 is added to the via 24 (e.g. the drilled hole is electroplated with copper), an electrical connection will be made between the segment 18 and the via 24. With segments 18 where an electrical connection is not desired, the segment 18 may define an isolation aperture 42 that isolates the segment 18 from the via 24. As shown in FIG. 7, the isolation aperture 42 is concentric with the via aperture 24 and has a diameter greater than the corresponding via aperture 26. Because the isolation aperture 42 has a greater diameter than the via aperture 26, the conductor 28 will not make an electrical connection with the segment 18. Although the conductors 28 in the illustrated vias 24 are formed by electroplated copper, the conductors 28 may be formed by other conductive materials. For example, a conductor material, such as a segment of wire, may be press-fitted through the via apertures 24 in the PCB coil 20 (not shown). As another example, the via apertures 24 may be filled with solder to define the conductors 28 (not shown).

Figure 3:
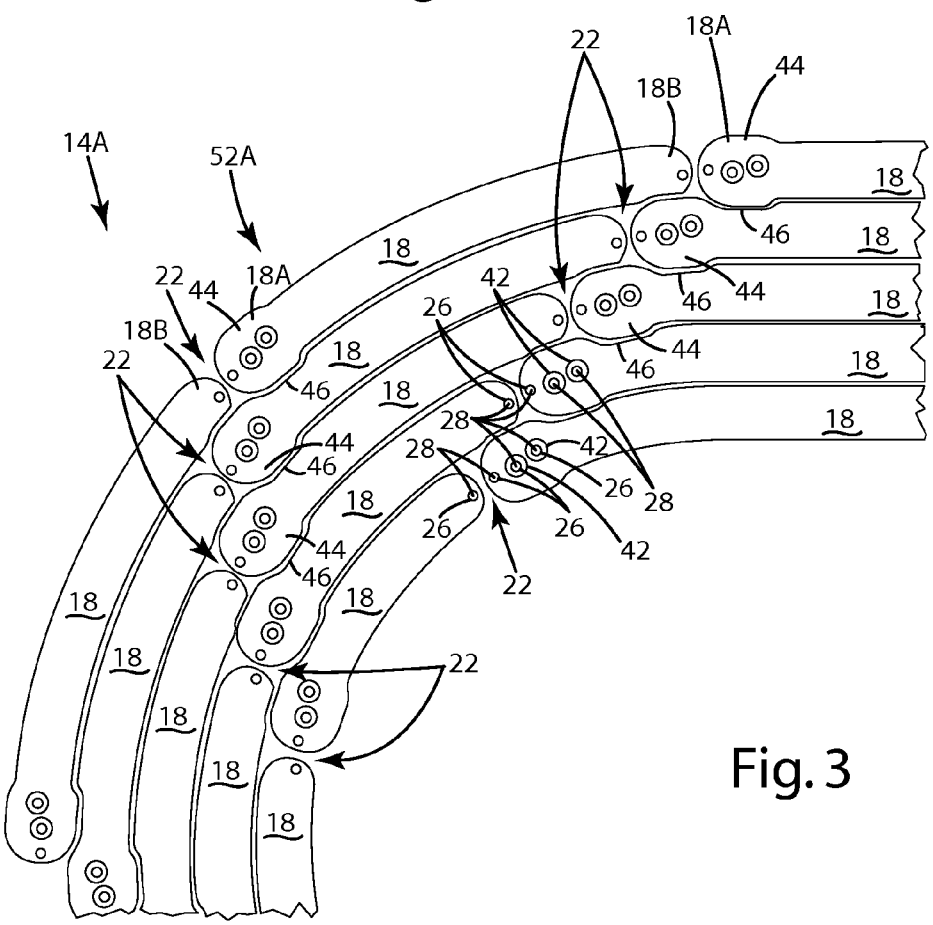
FIG. 3 is a top plan view of a corner portion of a single spiral trace.
Figure 4:
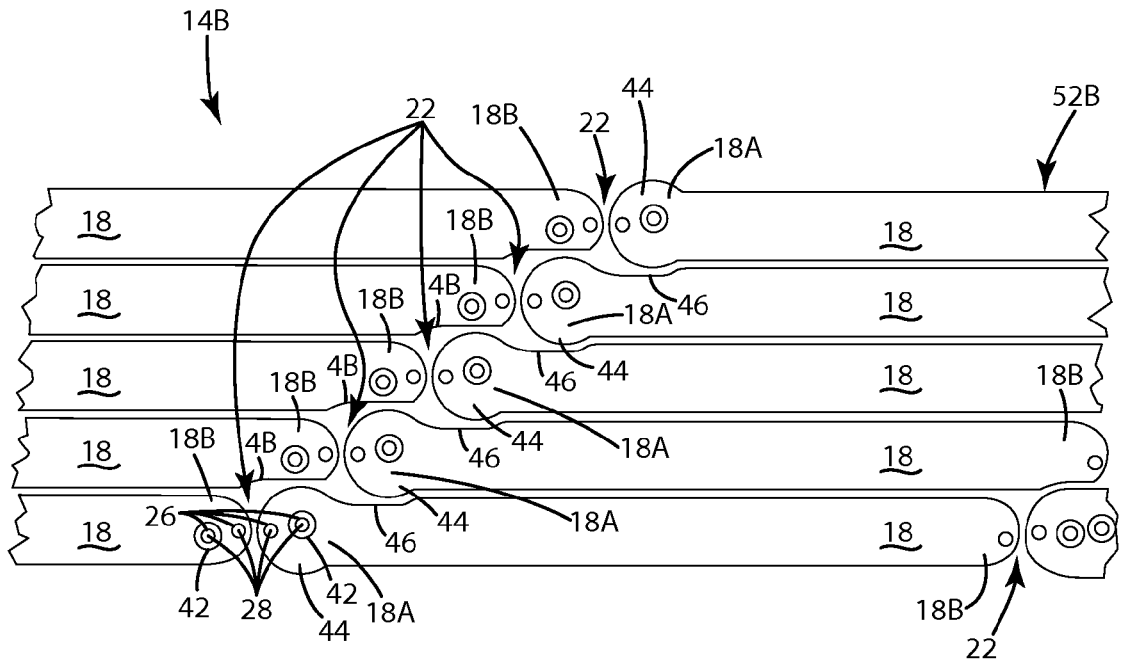
FIG. 4 is a top plan view of a straight portion of a single spiral trace.
Figure 5:
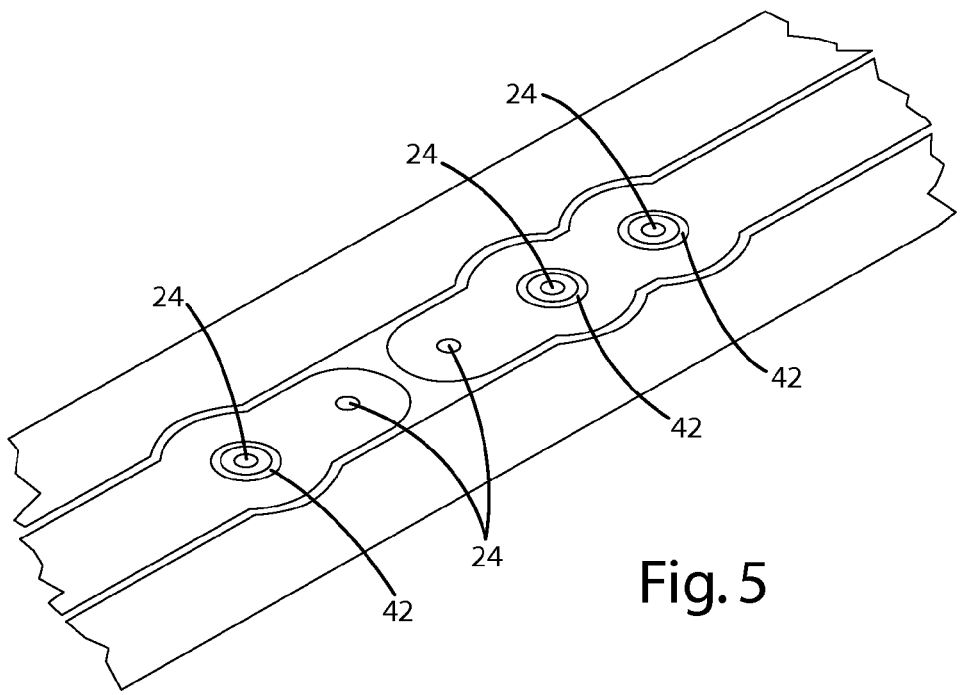
FIG. 5 is a perspective view of a portion of an alternative PCB coil showing an alternative construction for minimizing constriction at an interface.

To address the potential issue of increased resistance caused by the removal of conductor material for the isolation apertures 42, the interchanges 22 may have a special shape. For example, as perhaps best shown in FIGS. 3 and 4, enlarged portions 44 of each trace may be provided around the isolation apertures 42 and vias 24 to provide additional conductor area for current flow. In the illustrated embodiment, the traces are enlarged around the isolation apertures 42 to a degree where it is desirable to provide reduced width of portions 46 in the trace in adjacent loops. An alternative interchange construction is shown in FIG. 5. In this alternative construction, each trace is enlarged around each isolation aperture 42, but not each via 24. The enlarged regions are not strictly necessary and may be eliminated, if desired. For example, in some applications, the spacing between adjacent loops may be great enough to avoid the need to reduce the width of portions of the trace in adjacent loops. In other applications, the affect on resistance caused by removal of conductor material for the isolation apertures 42 may not be sufficient to warrant enlarged regions in the traces 52a-d.

Figure 6:
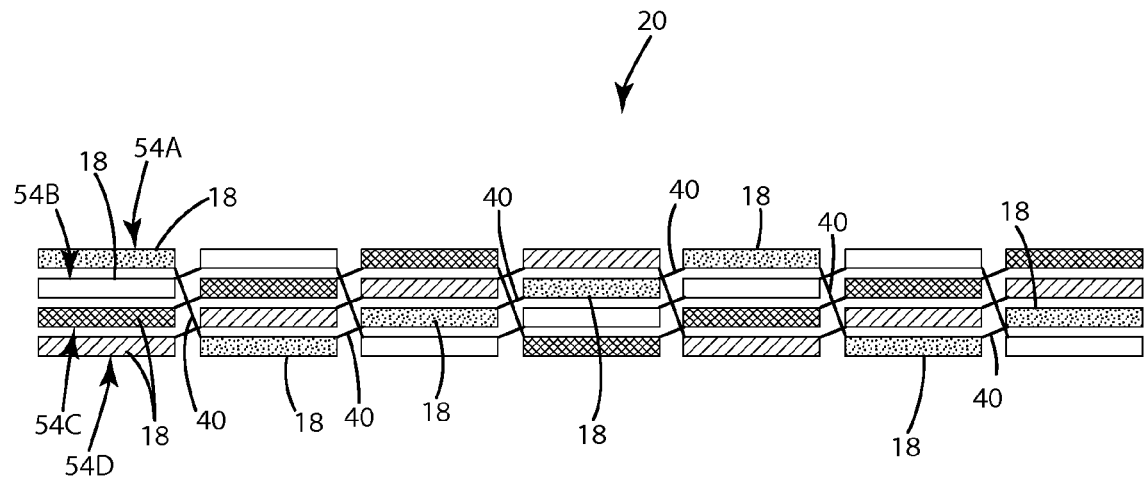
FIG. 6 is a schematic representation of the connection scheme between segments of the various layers.

As noted above, the segments 18 are interconnected by connectors 40 to define a plurality of filaments 54a-d or discrete electrical flow paths through the coil. FIG. 1C shows traces 52a-d with the segments 18 of a single filament (i.e. filament 54a) shaded. The shaded segments 18 are numbered consecutively from S1 to S78 to show the order in which the segments are electrically connected. For example, segment S1 of trace 52a is electrically connected to segment S2 of trace 52b, segment S2 is electrically connected to segment S3 of trace 52c and so on through segment S78. FIG. 6 shows a schematic representation of the electrical connection scheme of the illustrated embodiment of the present invention showing portions of all four filaments 54a-d, which each filament 54a-d having different shading. The illustration represents a side view of a seven-segment long portion of the coil 20, and shows the segments 18 of different layers interconnected by interlayer connectors 40. The illustrated connection scheme is intended to provide a coil in which the filaments spend substantially equal amounts of time in proximity to the paired coil (e.g. a separate coil inductively coupled with the PCB coil) so that like the strands in a litz wire coil, the filaments 54a-d each intercept a substantially equal amount of magnetic flux lines, thereby inductively generating a substantially equal amount of current and contributing substantially equally to the self or mutual inductance of the coil. This provides substantially uniform distribution of current flow through the different filaments, thereby reducing losses and improving overall efficiency of the PCB coil 20. These benefits are provided in part by decreasing the capacitance in the coil. Instead of the relatively large parasitic capacitance generated due to the surface area of stacked coils separated by a distance, a relatively smaller parasitic capacitance is generated by the smaller surface area of segments separated by a distance. Further, because of the segment arrangement, some of the capacitance fringe effects caused by the segments may cancel each other out. Less capacitance allows inductance to be maximized which can result in lower resistance and less losses. In this way, the PCB coil 20 simulates a litz wire coil, but the PCB coil is thinner and allows for tighter coupling than a litz wire coil that is hampered by its packing density. The connection scheme may vary from application to application depending on the design and configuration of the PCB coil and the paired coil. In the illustrated scheme, the PCB coil 20 includes segments 18 that are interconnected to define four filaments (or separate current flow paths) that undulate from layer to layer 14a-d through the spiral traces and have a substantially equal amount of segments 18 on each layer 14a-d. The different filaments 54a-d are represented in FIG. 6 by different shading. All of the segments 18 and connectors 40 that define filament 54a are numbered in FIG. 6. To avoid clutter, only one segment 18 of each of the remaining filaments 54c-d is numbered. Like filament 54a, the remaining filaments 54b-d are defined by all segments 18 of the same shading and all connectors 40 interconnecting segments 18 of the same shading. When using the illustrated connection scheme, the number of filaments will be equal to the number of conductor layers 14a-d, however, the present invention is not limited to connection schemes that follow this rule. To facilitate disclosure of the connection scheme applied in illustrated embodiment, each segment 18 will be defined as having an inner end 18a and an outer end 18b. The inner end 18a is the end closest to the center of the spiral and the outer end 18b the end farthest from the center of the spiral. The inner end 18a of each segment is electrically connected to the outer end 18b of the segment in the immediately underlying layer, with one exception. The inner ends 18a of the segments 18 on the lowermost layer 14d are electrically connected to the outer ends 18b of the segments 18 on the uppermost layer 14a. Following this connection scheme, each filament 54a-d drops down one layer 14a-d as it moves one segment 18 closer to the innermost end of the coil. When a filament 54a-d reaches the bottom layer 14d it jumps back to the top layer 14a while moving one segment 18 closer to the innermost end of the coil and then repeats the single layer descension pattern. This pattern repeats itself for each filament 54a-d through the length of the spiral coil. As a result, in the illustrated embodiment, each filament 54a-d undulates repeatedly between the top layer 14a and bottom layer 14d passing sequentially through each intermediate layer 14b and 14c as it transitions. As can be seen, the different filaments 54a-d follow essentially parallel (but offset) paths as they undulate through the PCB coil 20. The specific segment and connection pattern may be varied from application to application as desired with the goal of presenting a coil in which each filament 54a-d inductively receives a substantially equal amount of power from the paired coil and contributes sufficiently equally to the self or mutual inductance characteristics of the inductive coupling. For example, the pattern may be reversed with each filament passing layer by layer upwardly to the uppermost layer and then returning to the bottommost layer.

Figure 8A:
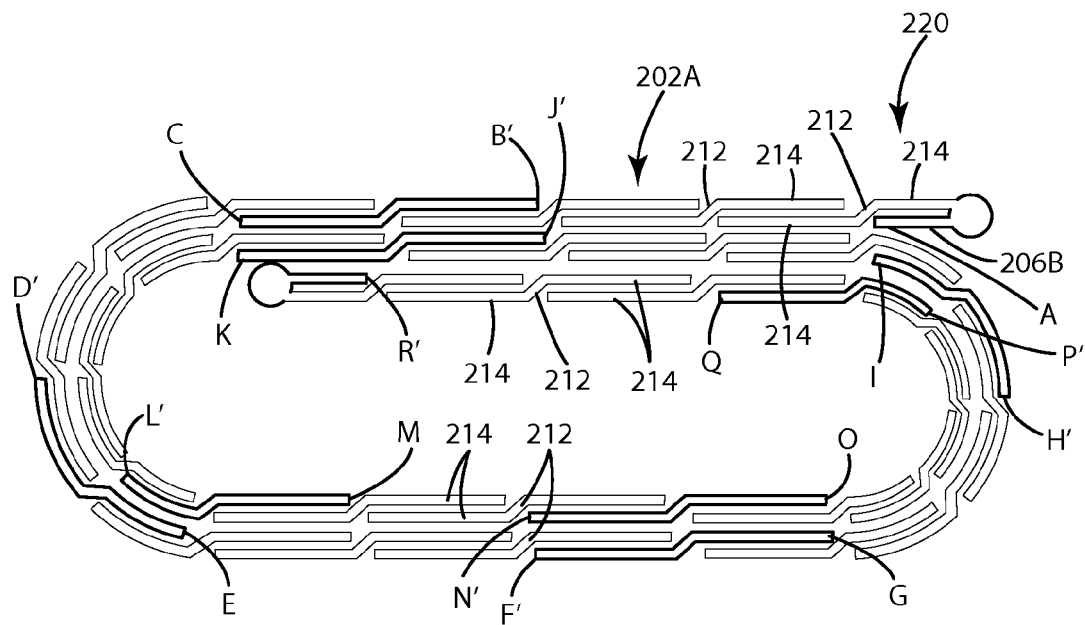
FIG. 8A is a top plan view of the top conductor layer of a first alternative PCB coil with upward/downward and inward/outward filament undulations.
Figure 8B:
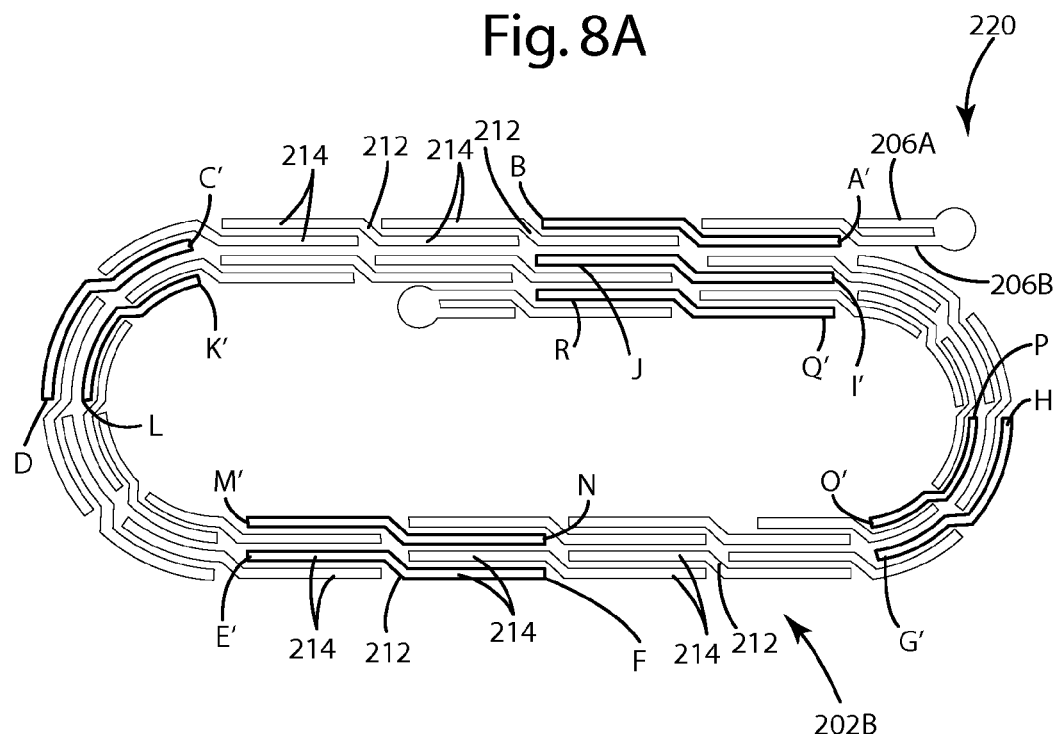
FIG. 8B is a top plan view of the bottom conductor layer of the first alternative PCB coil.
Figure 9:
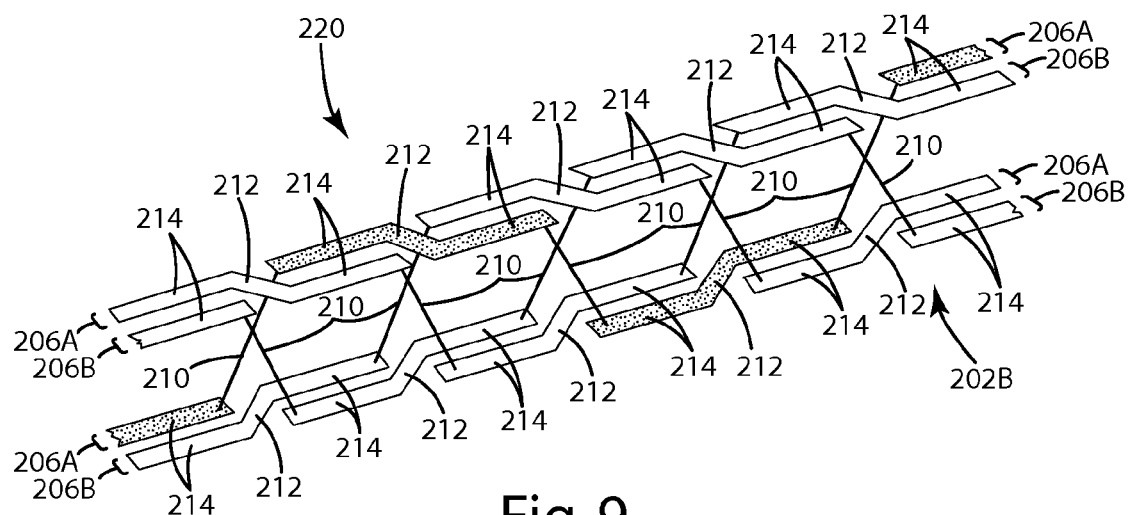
FIG. 9 is an exploded representational perspective view of a portion of the first alternative PCB coil.

As can be seen, PCB coil 20 includes a plurality of filaments that undulate upwardly/downwardly through the layers as they spiral inwardly through the coil 20. In an alternative embodiment, the PCB coil 220 may be configured to additionally provide inward/outward undulation of the filaments within each layer. FIGS. 8A-8B and 9 show an alternative embodiment of the present invention that provides both upward/downward and inward/outward undulations. In this embodiment, the PCB coil 220 includes two conductor layers 202a-b separated by an insulator layer (not shown). Referring now to FIGS. 8A and 8B, each conductor layer 202a-b may include two adjacent, segmented traces 206a and 206b in the form of substantially parallel lines that spiral in a paired relationship. The PCB coil 220 includes interlayer connectors 210 (See FIG. 9) and intralayer connectors 212 that collectively connect the segments 214 of different layers 202a-b and different traces 206a and 206b to define four separate filaments 208a-d.

As perhaps best shown in FIG. 9, the interlayer connectors 210 connect the segments 214 of the paired layers 202a-b to provide upward/downward undulation of the filaments 208a-d. FIG. 9 shows both layers 202a-b and both traces 206a-b for a portion of PCB coil 210. The interlayer connectors 210 are represented in FIG. 9 by lines, but it should be understood that the interlayer connectors 210 may be conventional vias or other conductors capable of providing an electrical connection between segments 214 of different layers 202a-b. For example, the interlayer connectors 210 may be essentially identical to the interlayer connectors discussed above, and may each include an interchange 216 and one or more vias 218. The intralayer connectors 212 of this embodiment connect segments 214 within the same layer 202a-b. As shown, the intralayer connectors 212 may be integral with the traces 206a-b. For example, segments 214 in different traces 206a-b may be integrally joined by the same conductor material used to form the segments 214. Alternatively, the segments 214 may be joined by separate electrical connectors added to the construction.

In this embodiment, the PCB coil segments 214 are connected in a pattern to define a plurality of filaments 208a-d that undulate upwardly/downwardly and inwardly/outwardly. The pattern may be selected so that each filament 208a-d spends substantially the same amount of time in proximity to a paired coil (not shown). This may be achieved, for example, by having each filament 208a-b undulate in a regular, repeating pattern such that each filament spends substantially the same amount of time on each layer and in each of the traces. The frequency of the undulations may be selected to provide the desired degree of uniformity between the filaments 208a-d. The combination of upward/downward undulations with inward/outward undulations may allow each filament 208a-d to more closely simulate the twisting nature of the strands of a litz wire coil than a PCB coil with only upward/downward undulations. FIGS. 8A-8B use reference numbers to represent the interlayer connectors 210. In this convention, two like reference numbers represent opposite ends of an interlayer connector 210. For example, reference numbers A and A' represent opposite ends of an interlayer connector 210 electrically connecting the two corresponding segments 214 and reference numbers B and B' represent opposite ends of another interlayer connector 210.

Figure 10:
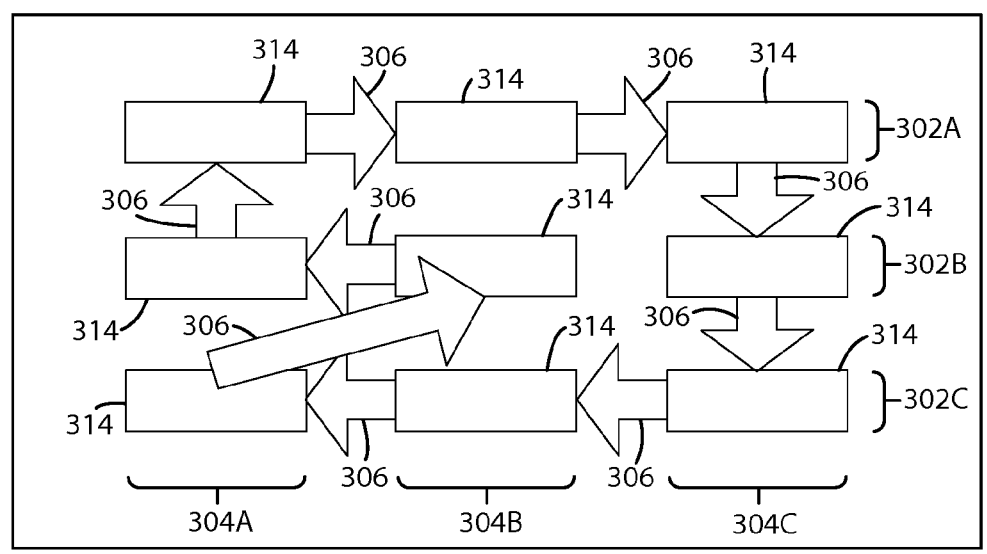
FIG. 10 is a schematic representation of a second alternative PCB coil having three layers and "tripled" traces.
Figure 11A:
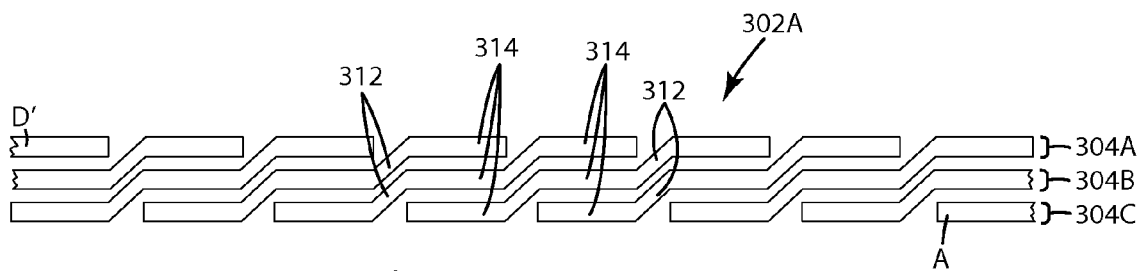
FIG. 11A is a top plan view of the top conductor layer of the second alternative PCB coil.
Figure 11B:
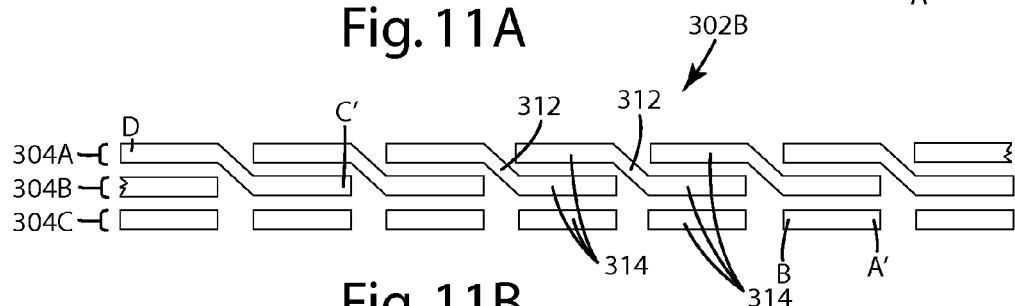
FIG. 11B is a top plan view of the middle conductor layer of the second alternative PCB coil.
Figure 11C:
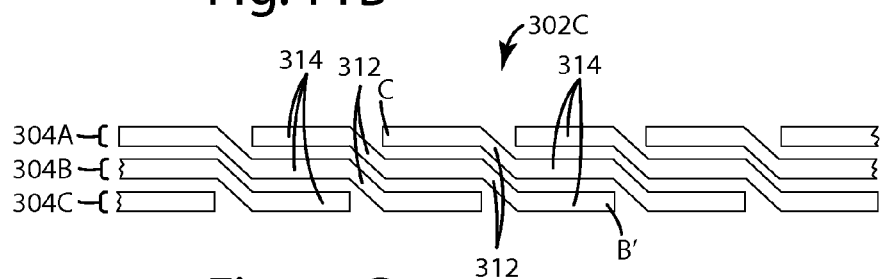
FIG. 11C is a top plan view of the bottom conductor layer of the second alternative PCB coil.
Figure 12:
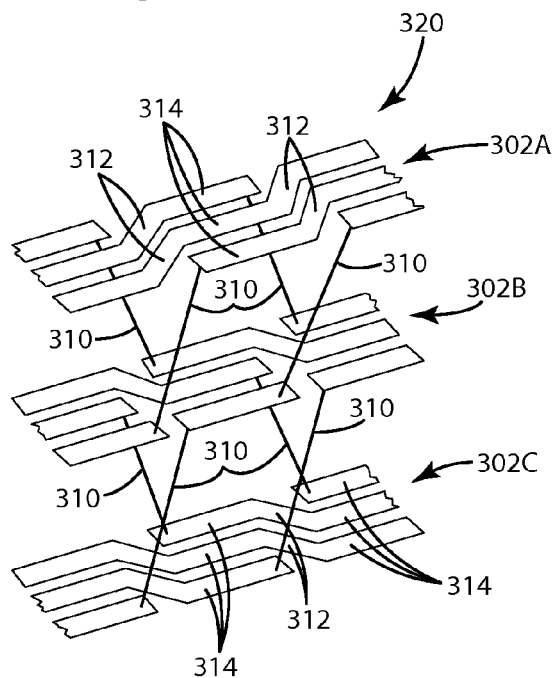
FIG. 12 is an exploded representational perspective view of a portion of the second alternative PCB coil.

The concept of upward/downward and inward/outward filament undulations can be carried on through additional layers and additional paired traces. For example, FIGS. 10, 11A-11C and 12 show a second alternative coil 320 with three layers 302a-c and "tripled" traces 304a-c (e.g. three traces that spiral together). FIG. 10 shows a representational cross-sectional view illustrating the connections 306 that may be included in a PCB coil with three layers and "tripled" traces. Each arrow in FIG. 10 represents a connection from the outer end of one segment 314 to the inner end of the next segment 314. As a result, the illustrated cross-sectional view shows a nine-segment long portion of a filament. The outer end of the ninth segment is connected to inner end of the 10$^{th}$ segment, which is in the same layer and same trace as the 1$^{st}$ segment—just 9 segments farther toward the inner end of the PCB coil. Each filament 316a-i will follow essentially the same flow path in a regular, repeating manner. FIGS. 11A-11C show traces of the three layers 302a-c of one implementation of PCB coil 320. FIGS. 11A-11C use essentially the same convention described above in connection with FIGS. 8A-8B to show the interlayer connectors 310 of PCB coil 320. For example, reference numbers A and A' represent opposite ends of an interlayer connector 310 electrically connecting the two corresponding segments 314 and reference numbers B and B' represent opposite ends of another interlayer connector 310. The segment connections are further illustrated in FIG. 12. FIG. 12 shows all three layers and all three traces for a portion of PCB coil 320. FIG. 12 also shows interlayer connectors 310 and intralayer connectors 312.

Figure 13:
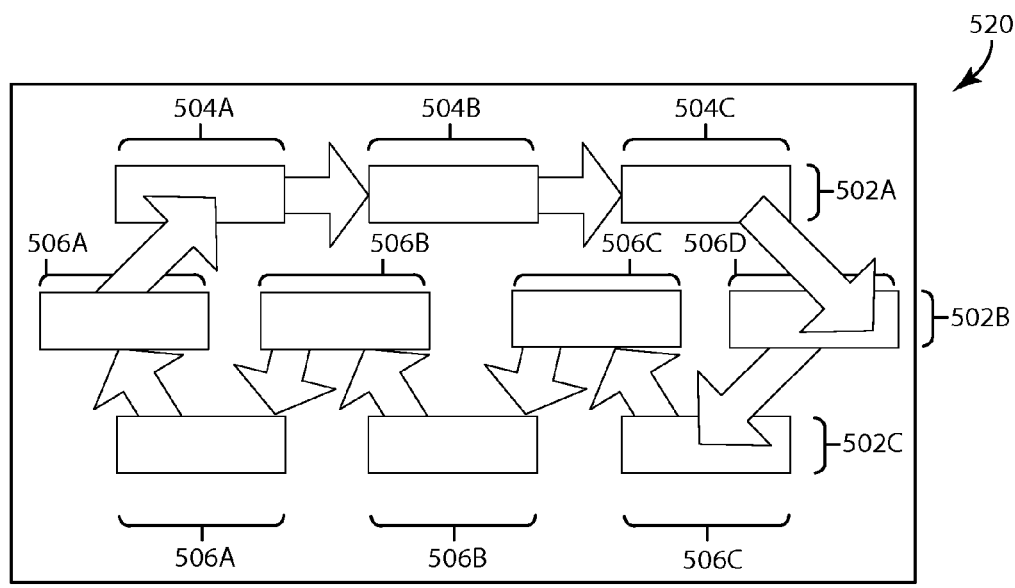
FIG. 13 is a schematic representation of a third alternative PCB coil three-layer coil with upward/downward and inward/outward undulations.

FIG. 13 illustrates another alternative coil configuration using essentially the same illustration convention used in connection with FIG. 10 (described above). In this alternative embodiment, the coil 520 includes three conductor layers 502a-c that are separated by insulator layers (not shown). The uppermost layer 502a includes "tripled" traces 504a-c, the second layer 502b includes "quadrupled" traces 506a-d, and the lowermost layer 502c includes "tripled" traces 508a-c. As shown, the second layer 502b is configured with traces 506a-d that are vertically aligned with the gaps between the traces 504a-c and 508a-c of the uppermost layer 502a and the lowermost layer 502c. As a result, the traces 504a-c, 506a-d and 508a-c overlap so that there is not an open vertical path through the PCB coil 520. The use of overlapping traces across the layers may improve the efficiency of the PCB coil 520 by reducing or eliminating any potential gaps through which magnetic flux may pass vertically without being intercepted by a conductor layer.

Figure 14:
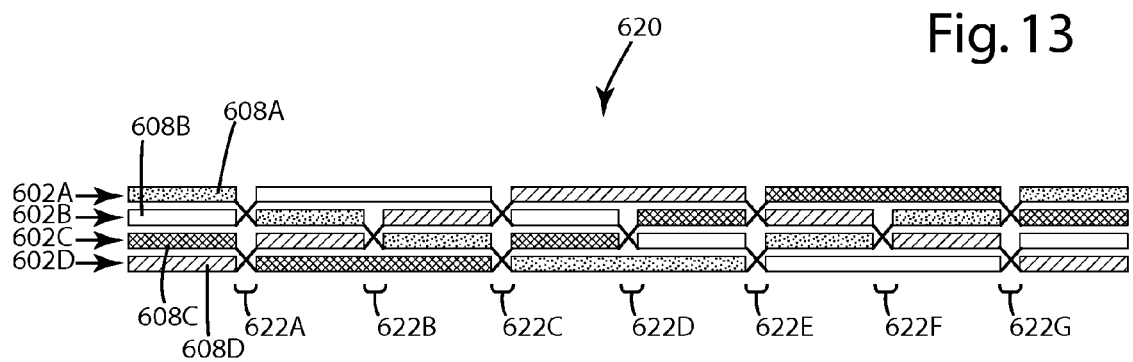
FIG. 14 is a schematic representation of a fourth alternative PCB coil.

FIG. 14 is a schematic representation of another alternative printed circuit board coil 620. The coil 620 of this embodiment includes an alternative interchange configuration that provides reduced resistance and reduced capacitance. This illustration shows the layers 602a-d of the coil 620 positioned one atop another with the segments 618 represented by boxes and the vias represented by lines interconnecting the boxes. In the embodiment of FIG. 14, the coil 620 includes four layers 602a-d with each layer 602a-d having a single segmented trace 604a-d. The interchange scheme provides the coil 620 with filaments 608a-d that undulate upwardly/downwardly from layer to layer as they spiral inwardly/outwardly along traces 604a-d. In FIG. 14, each filament 608a-d is represented by a plurality of connected boxes that share common shading. As shown, the coil 620 includes four filaments 608a-d that move upwardly/downwardly no more than a single layer at a time. For example, following filament 608a through a single cycle, we see that it begins in layer 602a transitions down to layer 602b at the first interchange 622a, down to layer 602c at the second interchange 622b and finally down to layer 602d at the third interchange 622c. After reaching the bottom layer 602d, the filament 608a remains on the bottom layer 602d through the fourth interchange 622d. At the fifth interchange 622e, the filament 608a begins its transition back toward the first layer 602a. More specifically, the filament 608a transitions up to layer 602c at the fifth interchange 622e, up to layer 602b at the sixth interchange 622f and finally back to the top layer 602a at the seventh interchange 622g. After returning to the top layer 602a, the filament 608a remains on the top layer 602a through the next interchange (in this case, the eighth interchange) and then repeats the cycle over and over again until the opposite end of the coil is reached. In the embodiment of FIG. 14, the remaining filaments 608b-d follow essentially identical and parallel paths through the coil being offset from one another because they start at different layers 602b-d in the coil 620.

FIGS. 15A-D show the four traces 604a-d of the coil 620. The four traces 604a-d are shown in the same orientation so that the illustrations may be overlayed to show their alignment in the assembled coil 620. The first two traces 604a-b may be disposed on opposite sides of a single circuit board substrate, while the second two traces 604c-d may be disposed on opposite sides of a second circuit board substrate. The two circuit board substrates carrying the four traces 604a-d may be intersecured to form an assembly with four layers 602a-d and four traces 604a-d. The two circuit board substrates may be joined together by an adhesive, such as by a layer of epoxy-impregnated fiberglass, or by any other suitable method of manufacture.

Figure 16:
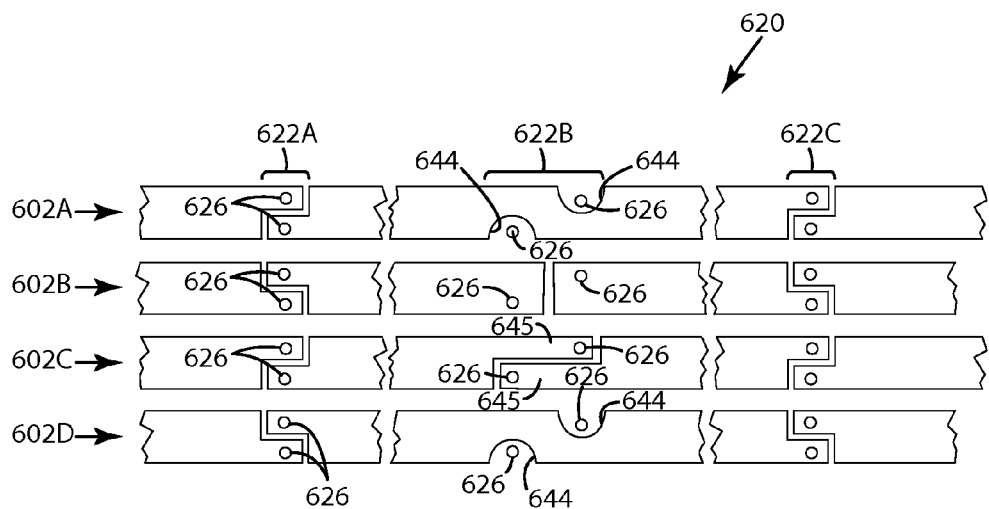
FIG. 16 is a representation of the connection scheme of the fourth alternative PCB coil of FIG. 14.
Figure 15A:
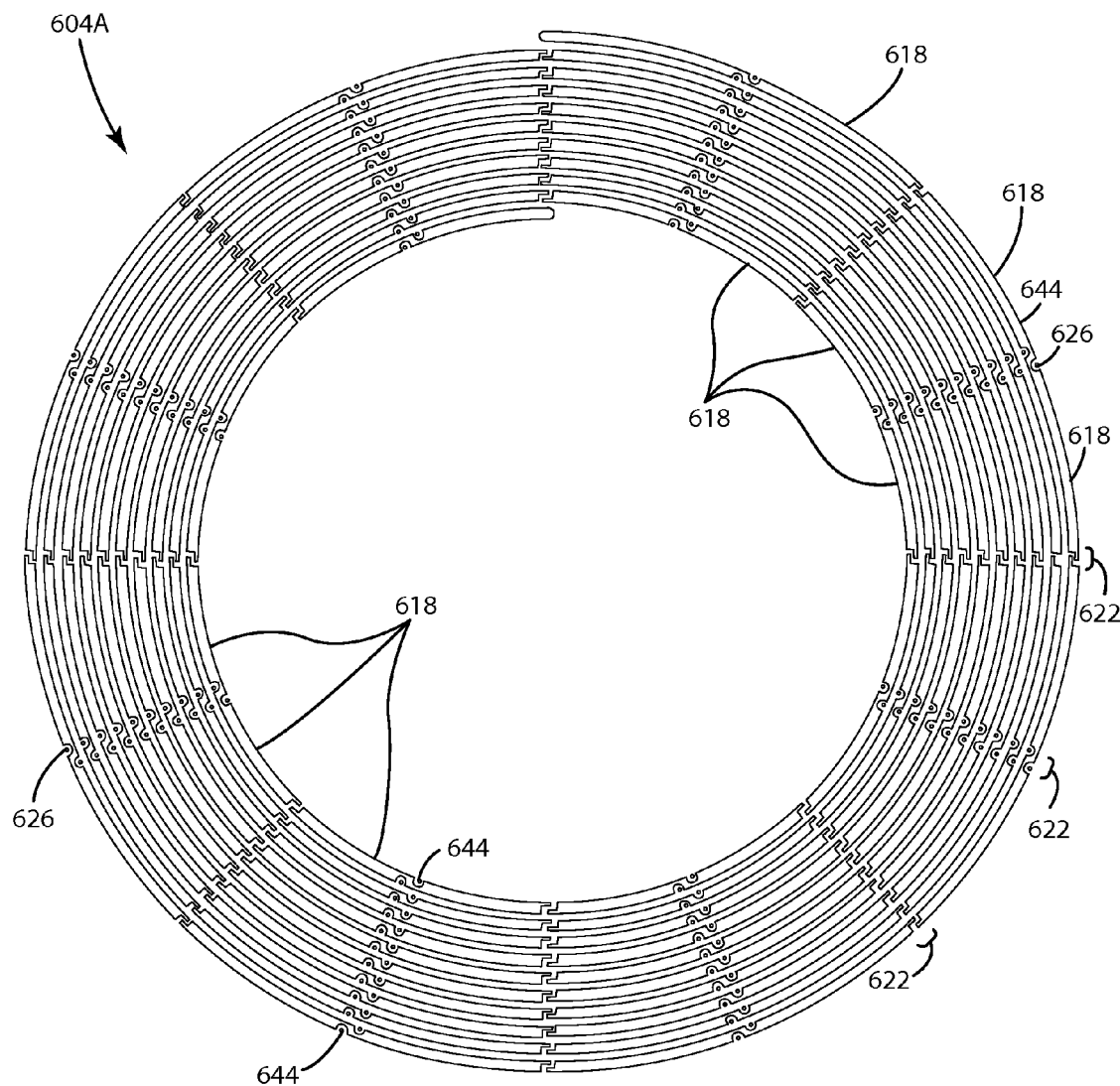
FIG. 15A is a top plan view of the first layer of the fourth alternative PCB coil of FIG. 14.
Figure 15B:
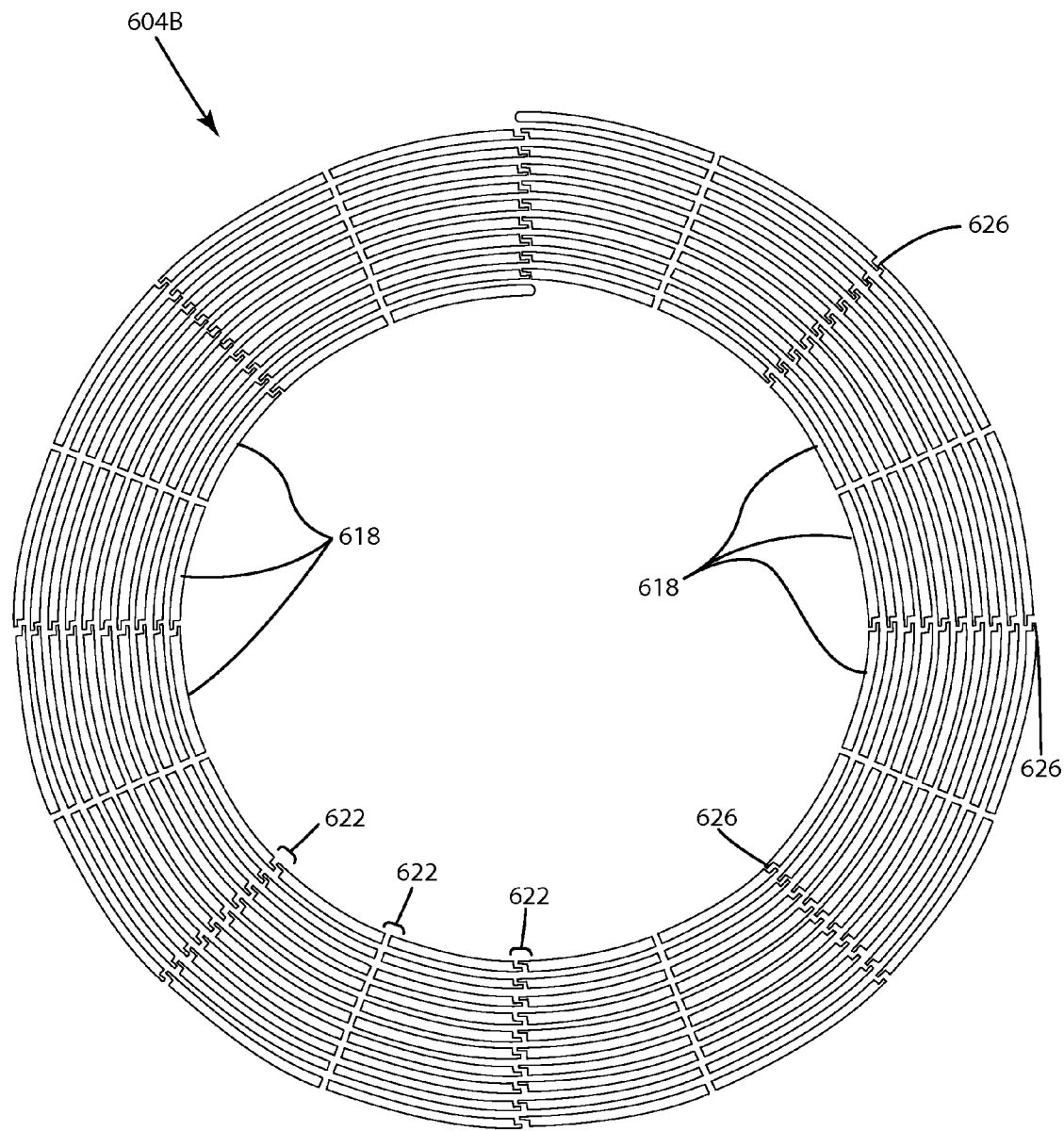
FIG. 15B is a top plan view of the second layer of the fourth alternative PCB coil of FIG. 14.
Figure 15C:
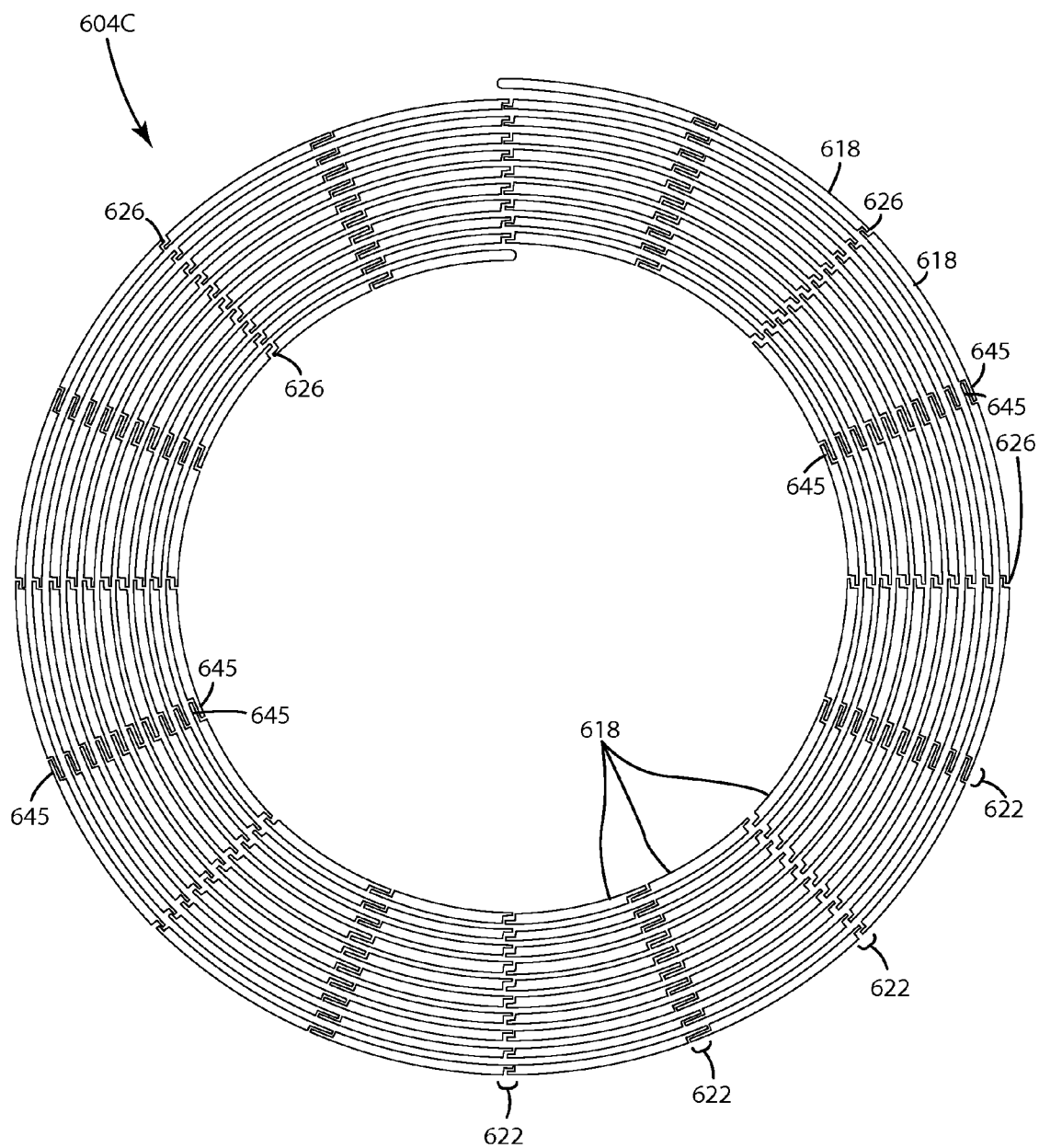
FIG. 15C is a top plan view of the third layer of the fourth alternative PCB coil of FIG. 14.
Figure 15D:
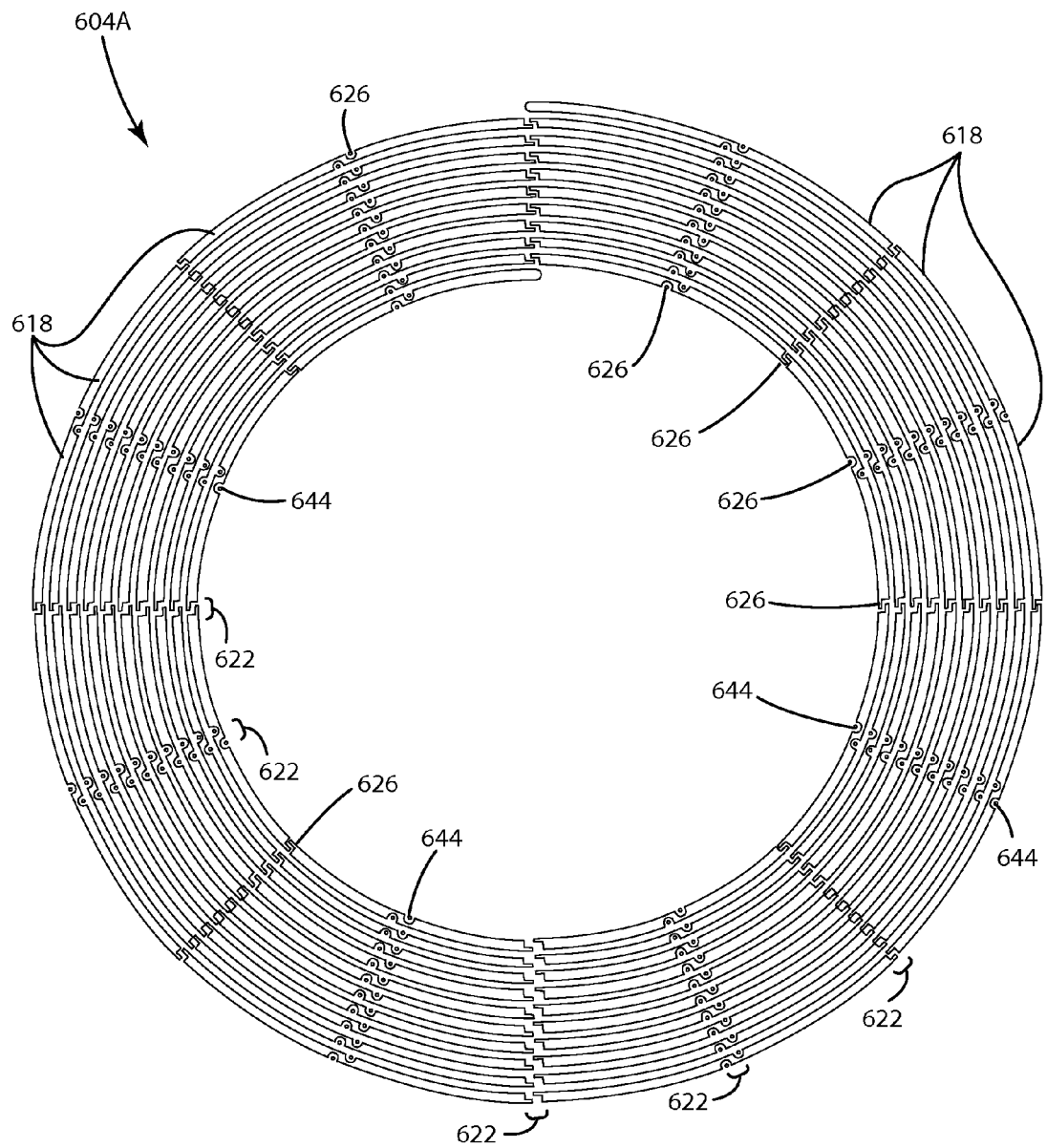
FIG. 15D is a top plan view of the fourth layer of the fourth alternative PCB coil of FIG. 14.

The interchange configuration of this embodiment will now be described in connection with FIG. 16. FIG. 16 is a representation of a portion of the coil 620 showing corresponding segments of the coil of the four layers 602a-d illustrated in a side by side arrangement. It should be understood that these four layers are stacked one atop the other in the assembled coil 620. They are unstacked and placed side-by-side simply to facilitate disclosure. In general, the coil 620 includes two different types of interchanges that alternate one after another through the length of the coil 620. The first type of interchange, as exemplified by interchanges 622a and 622c, includes "blind" vias between layers 602a and 602b and between layers 602c and 602d. The blind vias interconnect the first segment in layer 602a with the second segment in layer 602b, and interconnect the first segment in layer 602b with the second segment in layer 602a. Similarly, the blind vias interconnect the first segment in layer 602c with the second segment in layer 602d, and interconnect the first segment in layer 602b with the second segment in layer 602c. As can be seen, the first type of interchange electrically interconnects the first two layers 602a and 602b and electrically connects the second two layers 602c and 602d. The blind vias may be manufactured by separately drilling holes 626 through the two circuit board substrates, for example, before the two substrates are assembled into the coil 620. The drilled holes 626 may be copper plated to provide electrical connections between the top two layers 602a and 602b and between the bottom two layers 602c and 602d. The copper plating may be applied to the blind vias in the two circuit board substrates while they are separate from one another.

Figure 18:
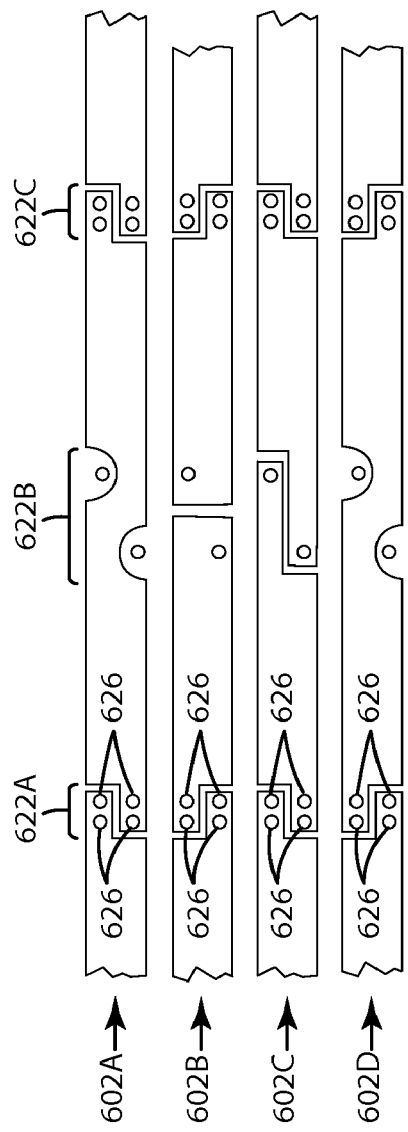
FIG. 18 is a schematic representation of a sixth alternative PCB coil.

In one embodiment, perhaps as best shown in FIG. 18, each layer 602a-d includes multiple vias. That is, multiple holes 626 are drilled through each circuit board substrate. As with other embodiments, the drilled holes 626 may be copper plated to provide electrical connections between different layers.

The second type of interchange, as exemplified by interchange 622b, includes vias that extend entirely through the assembly and electrically interconnect layers 602b and 602c. Referring again to FIG. 16, the second type of interchange interconnects the second segment of layer 602b with the third segment of layer 602c, and interconnects the second segment of layer 602c with the third segment of layer 602b. As can be seen, the second type of interchange electrically connects only the middle two layers 602b and 602c. The second type of interchange may be manufactured by drilling holes 626 entirely through the assembled coil (e.g. both substrates and the material separating the two substrates) and then applying a copper plating to the holes 626. As shown, the traces 604a and 604d in the top and bottom layers 602a and 602b have enlarged voids 644 that separate the copper plating in the holes 626 from the traces 604a and 604d. To reduce the resistance and capacitance resulting from the voids 644, adjacent voids 644 in the same layer may be offset along the length of the trace, as desired. The offset arrangement reduces the restriction on current flow through the copper plating between the two voids 644. It should be noted, however, that layer 602c includes fingers 645 that bridge the distance between the offset voids 644. The fingers 645 have reduced cross-sectional area and therefore may prevent some restriction to current flow as compared with portions of the traces that have full cross-sectional area. As a result, it may be desirable to balance the degree of offset between the voids 644 with the corresponding increase in the length of the fingers 645. As can be seen, the traces 604b and 604c in the middle two layers 602b and 602c do not include these voids 644, but rather are in direct electrical connection with the copper plating. As a result, the copper plating interconnects the segments of the second and third layers 602b and 602c. By alternating the first type of interchange (e.g. interchange 622a) and second type of interchange (e.g. interchange 622b), the coil 620 provides the filament undulation pattern described above.

Figure 17:
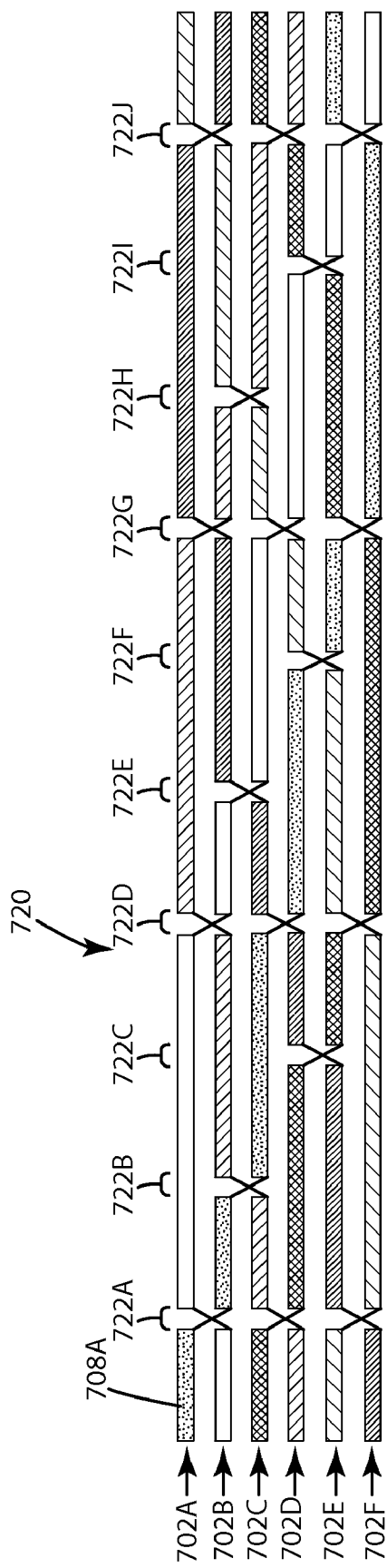
FIG. 17 is a schematic representation of a fifth alternative PCB coil.

FIG. 17 is a representation of another alternative embodiment in which the interchange configuration of the embodiment of FIG. 14 is carried out in six layers. This representation follows the same conventions used in connection with FIG. 6 and FIG. 14. As shown, the coil 720 includes three different types of interchanges. The first type of interchange, exemplified by interchanges 722a, 722d, 722g and 722j, provides three sets of blind vias. The first set of blind vias interconnects layers 702a and 702b, the second set interconnects layers 702c and 702d, the third set interconnects layers 702e and 702f. The blind vias may be manufactured in essentially the same way as the blind vias of coil 620 as described above. The second type of interchange, as exemplified by interchanges 722b, 722e, and 722h, connects only layers 702b and 702c. For this type of interchange, layer 702b may include full ends similar to those of layer 602b at interchange 622b of FIG. 16, and layer 702c may include fingers similar to those of layer 602c at interchange 622b of FIG. 16. To facilitate the vias need to electrically connect layers 702b and 702c, layers 702a and 702d-f may include voids similar to voids 644 of coil 620. The third type of interchange, as exemplified by interchanges 722c, 722f and 722i, interconnects only layers 702d and 702e. For this type of interchange, layer 702d may include full ends similar to those of layer 602b at interchange 622b of FIG. 16, and layer 702e may include fingers similar to those of layer 602c at interchange 622b of FIG. 16. To facilitate the vias need to electrically connect layers 702d and 702e, layers 702a-c and 702f may include voids similar to voids 644 of coil 620. By repeatedly cycling through these three types of interchanges, the filaments 708a-f undulate up and down through the layers 702a-f no more than one layer at a time. In the illustrated embodiment, a single filament 708a remains on layer 702a for a distance equal to approximately three segments, transitions down to layer 702b for one segment, transitions down to layer 702c for a distance equal to approximately two segments, transitions down to layer 702d for a distance equal to approximately two segments, transitions down to layer 702e for one segment and then transitions to layer 702f for a distance equal to approximately three segments. The filament 708a then follows the same pattern (although in mirror) as it transitions one layer at a time back to the top layer.

The above description is that of the current embodiment of the invention. Various alterations and changes can be made without departing from the spirit and broader aspects of the invention as defined in the appended claims, which are to be interpreted in accordance with the principles of patent law including the doctrine of equivalents. Any reference to claim elements in the singular, for example, using the articles "a," "an," "the" or "said," is not to be construed as limiting the element to the singular.

The embodiments of the invention in which an exclusive property or privilege is claimed are defined as follows:

1. A printed circuit board coil for use with a paired coil comprising:
   a substrate;
   a plurality of conductor layers, each conductor layer including a plurality of discrete coil segments; and
   a plurality of interlayer connectors electrically interconnecting said plurality of discrete coil segments of different layers to define a plurality of discrete filaments, each of said filaments having two filament ends and each of said filaments following substantially identical, but offset, undulations through said plurality of layers.

2. The printed circuit board coil of claim 1 wherein each of said filaments follows substantially identical, but offset, regular, repeating undulations through said plurality of layers.

3. The printed circuit board coil of claim 1 wherein said coil is paired with a second coil; and
   wherein said segments and said interlayer connectors are configured so that each filament spends a substantially equal amount of time in proximity to the paired coil, whereby the printed circuit board coil simulates a coil of litz wire.

4. The printed circuit board coil of claim 1 further including an insulator layer disposed between adjacent pairs of said conductor layers.

5. The printed circuit board coil of claim 1 wherein each of said plurality of conductor layers includes a spiral trace.

6. The printed circuit board coil of claim 5 wherein each of said traces includes an interchange, said interlayer connectors including a plurality of vias selectively routed through said interchanges.

7. The printed circuit board coil of claim 5 wherein each of said spiral traces includes an innermost end and an outermost end, each of said segments including an inner end toward said innermost end of said spiral trace and an outer end toward said outermost end of said spiral trace; and
   wherein each of said filaments is defined by electrically connecting said inner end of one of said segments with said outer end of another of said segments in a continuous chain from one of said spiral trace outermost ends of one of said traces to one of said innermost ends of one of said traces.

8. The printed circuit board coil of claim 1 wherein said plurality of segments defines a first spiral trace and a second spiral ace on each conductor layer; and
   further including a plurality of intralayer connectors for electrically connecting said segments from said first spiral trace with said segments of said second spiral trace within a single one of said conductor layers, said interlayer connectors and said intralayer connectors cooperatively defining said filaments following substantially identical, but offset, undulations within each of said layers and through each of said plurality of layers.

9. The printed circuit board coil of claim 1 wherein a first one of said conductor layers includes a spiral trace having a plurality of loops and wherein each segment of said trace of said first conductor layer is spaced apart from said segments of any adjacent loops of said first conductor layer to define a space; and
   wherein a second one of said conductor layers includes a spiral trace having a plurality of loops and wherein each segment of said trace of said second conductor layer is positioned to overlap said space of said first conductor layer.

10. The printed circuit board coal of claim 1 wherein one of each of said filament ends are connected to a common point and each of the other of said filament ends are connected to a different common point.

11. A printed circuit board coil assembly comprising:
    an insulative substrate;
    a first conductor layer disposed on said substrate, said first conductor layer including a first trace having a plurality of discrete coil conductor segments;
    a second conductor layer disposed on said substrate on a side opposite said first conductor layer, said second conductor layer including a second trace having a plurality of discrete coil conductor segments; and
    a plurality of interlayer connectors interconnecting said plurality of discrete coil conductor segments of said first conductive layer with said plurality of discrete coil conductor segments of said second conductive layer in a predetermined pattern to define a plurality of interconnected segments, wherein said plurality of interconnected segments define at least two filaments that undulate in a predetermined pattern between said first conductor layer and said second conductor layer, each of said at least two filaments having an innermost filament end and an outermost filament end.

12. The printed circuit board coil assembly of claim 11 further including:
    a second insulative substrate positioned adjacent said first insulative substrate;
    a third conductor layer disposed on said second substrate, said third conductor layer having a third trace including a plurality of discrete conductor segments;
    a fourth conductor layer disposed on said second substrate on a side opposite said third conductor layer, said fourth conductor layer including a fourth trace having a plurality of discrete conductor segments; and
    a plurality of interlayer connectors electrically interconnecting said segments of said first layer, said segments of said second layer, said segments of said third layer and said segments of said fourth layer in a predetermined pattern, wherein said interconnected segments define at least two filaments that undulate in a predetermined pattern between said first conductor layer, said second conductor layer, said third conductor layer and said fourth conductor layer.

13. The printed circuit board coil assembly of claim 11 wherein said first conductor layer includes a second trace having a plurality of discrete conductor segments; and
    further including a plurality of intralayer connectors electrically connecting said segments of said first trace with said segments of said third trace, whereby said filaments undulate in a predetermined pattern between said first conductor layer and said second conductor layer and between said first trace and said third trace.

14. The printed circuit board coil assembly of claim 13 wherein said second conductor layer includes a fourth trace having a plurality of conductor segments; and
    further including a plurality of intralayer connectors electrically connecting said segments of said second trace with said segments of said fourth trace, whereby said filaments undulate in a predetermined pattern between said first conductor layer and said second conductor layer and between said first trace and said third trace and between said second trace and said fourth trace.

15. The printed circuit board coil assembly of claim 11 wherein said filaments follow substantially parallel, but offset, paths undulating about said coil in a regular, repeating pattern.

16. The printed circuit board coil assembly of claim 11 wherein
each of said segments of said first trace having an inner end and an outer end, each of said segments of said second trace having an inner end and an outer end, each of said filaments being defined by a plurality of said segments interconnected by electrically connecting an inner end of one of said segments with an outer end of another of said segments in a continuous chain from said outermost filament end to said innermost filament end.

17. The printed circuit board coil assembly of claim 11 wherein each of said innermost filament ends are connected to a common point and each of said outermost filament ends are connected to a different common point.

18. A multilayer electromagnetic coil for a wireless power connection comprising:
a first conductor layer having a plurality of discrete coil conductor segments;
a second conductor layer disposed adjacent to said first conductor layer, said second conductor layer including a plurality of discrete coil conductor segments; and
a plurality of connectors interconnecting said plurality of discrete coil conductor segments of said first layer with said plurality of discrete coil segments of said second layer in a predetermined pattern to define a plurality of interconnected segments, wherein said plurality of interconnected segments define at least two filaments that undulate in a predetermined pattern between said first conductor layer and said second conductor layer, each of said at least two filaments having two filament ends.

19. The multilayer coil of claim 18 wherein said segments and said connectors are arranged such that each of said filaments are substantially uniformly distributed throughout the coil, whereby each of said filaments contributes substantially equally to an inductance of the coil.

20. The multilayer coil of claim 18 further including a third conductor layer disposed adjacent to said second conductor layer, said third conductor layer including a plurality of discrete conductor segments; and
said plurality of connectors interconnecting said segments of said first conductor layer, said second conductor layer and said third conductor layer in a predetermined pattern, wherein said interconnected segments define at least three filaments that undulate in a predetermined pattern through said first conductor layer, said second conductor layer and said third conductor layer, whereby each of said filaments contributes substantially equally to an inductance of the coil, each of said at east three filaments having two filament ends.

21. The multilayer coil of claim 18 in combination with a second inductive coil, said second inductive coil being inductive coupled with the coil, wherein said segments and said connectors are arranged such that each of said filaments are substantially uniformly distributed throughout the coil, whereby each of said filaments receives substantially uniform amounts of magnetic flux from said second coil.

22. The multilayer coil of claim 18 in combination with a second inductive coil, said second inductive coil being inductive coupled with the coil; and
further including a third conductor layer disposed adjacent to said second conductor layer, said third conductor layer including a plurality of discrete conductor segments, said plurality of connectors interconnecting said segments of said first conductor layer, said second conductor layer and said third conductor layer in a predetermined pattern, wherein said interconnected segments define at least three filaments that undulate in a predetermined pattern through said first conductor layer, said second conductor layer and said third conductor layer, whereby each of said filaments receives substantially uniform amounts of magnetic flux from said second coil each of said at least three filaments having two filament ends.

23. The multilayer coil of claim 18 wherein said conductor segments of said first layer define a first trace and a second trace, and
wherein said plurality of connectors interconnect said segments of said first trace and said second trace with said segments of said second layer in a predetermined pattern, wherein said interconnected segments define at least two filaments that undulate in a predetermined pattern between said first trace of said first conductor layer, said second trace of said first conductor layer and said second conductor layer.

24. The multilayer coil of claim 18 wherein both of said first and second conductive layers are equal average distance from a paired coil.

25. The multilayer coil of claim 18 wherein each of said first and second conductive layers transmit or receive a uniform amount of flux.

26. The multilayer electromagnetic coil of claim 18 wherein one of each of said filament ends are connected to a common point and each of the other of said filament ends are connected to a different common point.

* * * * *

UNITED STATES PATENT AND TRADEMARK OFFICE
CERTIFICATE OF CORRECTION

PATENT NO.        : 7,973,635 B2                                            Page 1 of 1
APPLICATION NO.   : 12/236832
DATED             : July 5, 2011
INVENTOR(S)       : Baarman et al.

It is certified that error appears in the above-identified patent and that said Letters Patent is hereby corrected as shown below:

Column 13, Claim 8, Line 53
 "ace" should be --trace--

Column 14, Claim 10, Line 6
 "coal" should be --coil--

Column 16, Claim 20, Line 3
 "east" should be --least--

Signed and Sealed this
Sixth Day of December, 2011

David J. Kappos
*Director of the United States Patent and Trademark Office*